United States Patent
Pellizzer et al.

(10) Patent No.: US 9,343,670 B2
(45) Date of Patent: May 17, 2016

(54) MEMORY ARRAYS AND METHODS OF FORMING SAME

(71) Applicant: Micron Technology, Inc., Boise, ID (US)

(72) Inventors: Fabio Pellizzer, Cornate D'Adda (IT); Antonino Rigano, Pioltello (IT)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/268,587

(22) Filed: May 2, 2014

(65) Prior Publication Data

US 2014/0291604 A1 Oct. 2, 2014

Related U.S. Application Data

(62) Division of application No. 13/358,882, filed on Jan. 26, 2012, now Pat. No. 8,728,940.

(51) Int. Cl.
*H01L 45/00* (2006.01)
*H01L 27/24* (2006.01)

(52) U.S. Cl.
CPC .......... *H01L 45/122* (2013.01); *H01L 27/2427* (2013.01); *H01L 27/2463* (2013.01); *H01L 45/1691* (2013.01); *H01L 45/06* (2013.01); *H01L 45/1233* (2013.01); *H01L 45/144* (2013.01); *H01L 45/1675* (2013.01)

(58) Field of Classification Search
CPC ............ H01L 27/2463; H01L 27/2481; H01L 45/1675; H01L 45/1691
See application file for complete search history.

(56) References Cited

U.S. PATENT DOCUMENTS

| | | | |
|---|---|---|---|
| 6,033,956 A * | 3/2000 | Wu ............................ | 438/261 |
| 6,632,741 B1 | 10/2003 | Clevenger et al. | |
| 7,335,906 B2 * | 2/2008 | Toda ............................ | 257/2 |
| 7,425,724 B2 * | 9/2008 | Aratani ................. | H01L 27/105 257/303 |
| 7,611,980 B2 | 11/2009 | Wells et al. | |
| 7,645,644 B2 * | 1/2010 | Sel et al. ...................... | 438/128 |
| 7,825,525 B2 | 11/2010 | Furukawa et al. | |
| 8,222,677 B2 * | 7/2012 | Baba .................. | G11C 13/0007 257/211 |
| 8,502,322 B2 * | 8/2013 | Nitta ....................... | H01L 27/24 257/296 |
| 8,922,020 B2 * | 12/2014 | Chen ................... | H01L 21/0337 257/692 |
| 2008/0057692 A1 * | 3/2008 | Wells .................. | H01L 21/0337 438/597 |
| 2009/0267042 A1 | 10/2009 | Happ et al. | |
| 2010/0092890 A1 | 4/2010 | Sandhu et al. | |
| 2010/0163822 A1 | 7/2010 | Ovshinsky et al. | |
| 2010/0173492 A1 | 7/2010 | Kim et al. | |
| 2010/0187591 A1 * | 7/2010 | Nagashima .................. | 257/314 |

(Continued)

OTHER PUBLICATIONS

Bez, Roberto. "Phase Change Memory: State of the Art and Perspective", 11th Leti Annual Review, Jun. 22-24, 2009 (34 pp.).
Kau, Derchang et al "A stackable cross point phase change memory", Electron Devices Meeting (IEDM), 2009 IEEE International, Dec. 7-9, 2009 (4 pp.).
Malventano, Allyn. "Intel and Numonyx announce vertical Phase Change Memory", PC Perspective, Oct. 28, 2009, <http://www.pcper.com/news/Storage/Intel-and-Numonyx-announce-vertical-Phase-Change-Memory> (2 pp.).

(Continued)

*Primary Examiner* — Bryan Junge
(74) *Attorney, Agent, or Firm* — Brooks, Cameron & Huebsch, PLLC

(57) ABSTRACT

Memory arrays and methods of forming the same are provided. One example method of forming a memory array can include forming a first conductive material having a looped feature using a self-aligning multiple patterning technique, and forming a first sealing material over the looped feature. A first chop mask material is formed over the first sealing material. The looped feature and the first sealing material are removed outside the first chop mask material.

18 Claims, 27 Drawing Sheets

(56) References Cited

U.S. PATENT DOCUMENTS

| | | |
|---|---|---|
| 2010/0232200 A1 | 9/2010 | Shepard |
| 2010/0301449 A1* | 12/2010 | Scheuerlein et al. ......... 257/528 |
| 2011/0049465 A1 | 3/2011 | Nagashima et al. |
| 2011/0070713 A1* | 3/2011 | Nansei .......................... 438/382 |
| 2011/0215436 A1 | 9/2011 | Tang et al. |
| 2011/0233505 A1 | 9/2011 | Nitta |
| 2011/0236836 A1 | 9/2011 | Park et al. |
| 2011/0278527 A1 | 11/2011 | Ishibashi |
| 2011/0278528 A1 | 11/2011 | Lung et al. |
| 2011/0316165 A1 | 12/2011 | You et al. |

OTHER PUBLICATIONS

Savage, Neil. "Numonyx Makes Stackable Phase-Change Memory", IEEE Spectrum, Nov. 17, 2009, <http://spectrum.ieee.org/semiconductors/memory/numonyx-makes-stackable-phasechange-memory> (2 pp.).

Wong, H.-S. Philip. "Emerging Memories", Department of Electrical Engineering, Stanford University, Stanford, California, Apr. 3, 2008 (77 pp.).

* cited by examiner

US 9,343,670 B2

MEMORY ARRAYS AND METHODS OF FORMING SAME

PRIORITY INFORMATION

This application is a divisional of U.S. application Ser. No. 13/358,882, filed Jan. 26, 2012, which is incorporated by reference.

TECHNICAL FIELD

The present disclosure relates generally to semiconductor devices and methods, and more particularly to memory arrays and methods of forming the same.

BACKGROUND

Memory devices are typically provided as internal, semiconductor, integrated circuits in computers or other electronic devices. There are many different types of memory, including random-access memory (RAM), read only memory (ROM), dynamic random access memory (DRAM), synchronous dynamic random access memory (SDRAM), resistive memory, and flash memory, among others. Types of resistive memory include phase change memory, programmable conductor memory, and resistive random access memory (RRAM), among others.

Memory devices are utilized as non-volatile memory for a wide range of electronic applications in need of high memory densities, high reliability, and data retention without power. Non-volatile memory may be used in, for example, personal computers, portable memory sticks, solid state drives (SSDs), digital cameras, cellular telephones, portable music players such as MP3 players, movie players, and other electronic devices.

Resistive memory devices include resistive memory cells that store data based on the resistance level of a storage element. The cells can be programmed to a desired state, e.g., corresponding to a particular resistance level, such as by applying sources of energy, such as positive or negative voltages to the cells for a particular duration. Some resistive memory cells can be programmed to multiple states such that they can represent, e.g., store, more than one bit of data.

The programmed state of a resistive memory cell may be determined, e.g., read, for example, by sensing current through the selected resistive memory cell responsive to an applied voltage. The sensed current, which varies based on the resistance level of the memory cell, can indicate the programmed state of the resistive memory cell.

In various resistive memory cell architectures, such as phase change cross-point architectures, management of word line and/or bit line decoding can be difficult and/or process intensive. For instance, as resistive memory arrays are scaled, the distance between adjacent word lines, and the distance between adjacent bit lines, is reduced, which can lead to shorts therebetween, and other issues.

BRIEF DESCRIPTION OF THE DRAWINGS

FIG. 3 illustrates an example conductive line layout a prior art line layout and chop mask orientation associated with an array formed in accordance with a number of embodiments of the present disclosure.

FIG. 4 illustrates an example conductive line layout and chop mask orientation associated with an array formed in accordance with a number of embodiments of the present disclosure.

DETAILED DESCRIPTION

Figure 1:
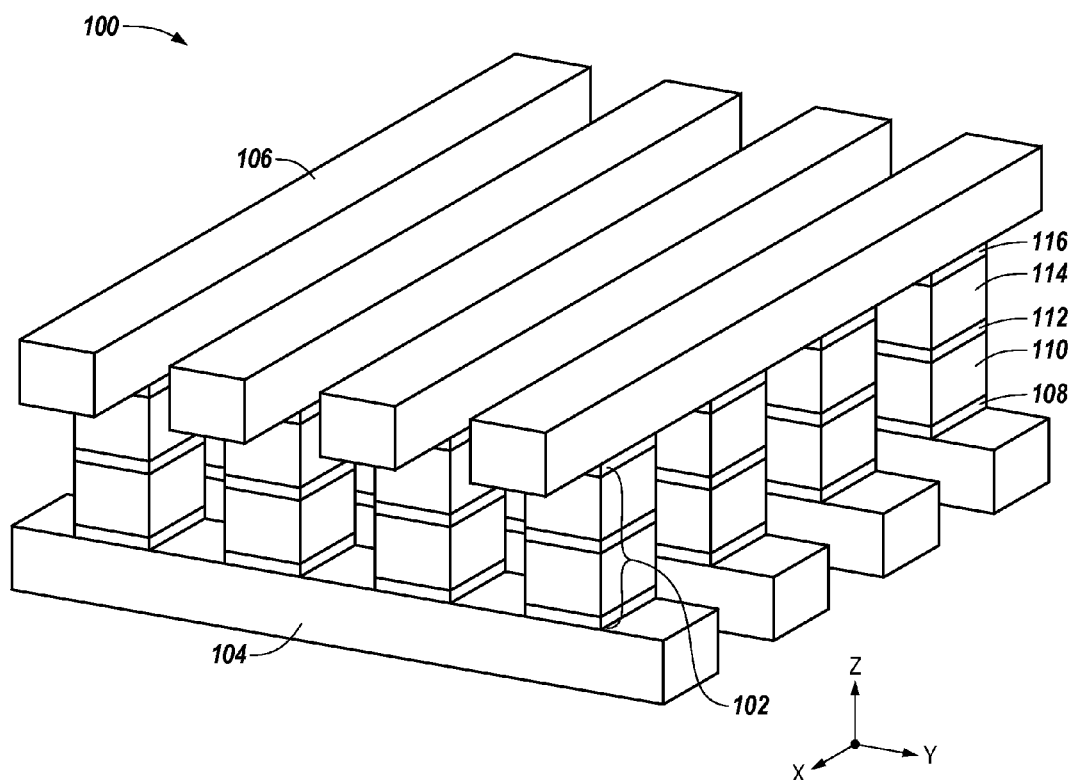
FIG. 1 illustrates a perspective view of a memory array in accordance with a number of embodiments of the present disclosure.

Memory arrays and methods of forming the same are provided. One example method of forming a memory array can include forming a first conductive material having a looped feature using a self-aligning multiple patterning (SAMP) technique, and forming a first sealing material over the looped feature. A first chop mask material is formed over the first sealing material. The looped feature and the first sealing material are removed outside the first chop mask material.

Embodiments of the present disclosure can provide benefits such as mitigating distortion and/or movement of features such as conductive lines, e.g., word lines and/or bit lines, during and/or resulting from a chop etch to remove loop ends of stacked materials, which may be formed by use of a SAMP technique, such as a self-aligning double patterning (SADP) technique, for instance. Mitigating such distortion and/or movement can reduce the risk of shorts between adjacent word lines and/or bit lines due to a "waggling" effect, for example, among other benefits. A "waggling" effect refers to a distortion and/or movement of a feature, such as a conductive line. A number of embodiments of the present disclosure can also provide a memory array architecture having a more compact socket region associated with coupling access lines, e.g., word lines, and/or date/sense lines, e.g., bit lines, to decode circuitry, as compared to previous array architectures.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure.

The figures herein follow a numbering convention in which the first digit or digits correspond to the drawing figure number and the remaining digits identify an element or component in the drawing. Similar elements or components between different figures may be identified by the use of similar digits. For example, 104 may reference element "4" in FIG. 1, and a similar element may be referenced as 204 in FIG. 2-1B. Also, as used herein, "a number of" a particular element and/or feature can refer to one or more of such elements and/or features.

FIG. 1 illustrates a perspective view of a memory array 100 in accordance with a number of embodiments of the present disclosure. The array 100 can be a cross-point array having memory cells 102 located at the intersections of a number of conductive lines, e.g., access lines 104, which may be referred to herein as word lines, and a number of conductive lines, e.g., data/sense lines 106, which may be referred to herein as bit lines. As illustrated, the word lines 104 are parallel to each other and are orthogonal to the bit lines 106, which are parallel or substantially parallel to each other. However, embodiments are not so limited. The word lines 104 and/or bit lines 106 can be a metal material such as tungsten, copper, titanium, aluminum, and/or other conductive materials, for example.

Each memory cell 102 can include a storage element coupled in series with a respective select device, e.g., access device, and can be formed in accordance with one or more embodiments described herein. The storage element can be a resistive storage element. The resistive storage element may include a material 110 formed between a pair of electrodes, e.g., 108 and 112. The memory material 110 can be a resistance variable material such as a phase change material (PCM), for example. The select device can be a two terminal device such as a diode or ovonic threshold switch (OTS), among other select device types. The select device can include a select device material 114 formed between a pair of electrodes, e.g., 112 and 116. The select device can be fabricated before or after the storage element is fabricated.

The electrodes 108, 112, and 116 can comprise materials such as Ti, Ta, W, Al, Cr, Zr, Nb, Mo, Hf, B, C, conductive nitrides of the aforementioned materials, e.g., TiN, TaN, WN, CN, etc.), and/or combinations thereof. Arrays of memory cells comprising a select device in series with a phase change material may be referred to as phase change material and switch (PCMS) arrays.

The resistive storage elements of cells 102 can include a resistance variable material 110, e.g., a phase change material. The phase change material can be a chalcogenide material, e.g., Ge—Sb—Te (GST), such as $Ge_8Sb_5Te_8$, $Ge_4Sb_4Te_7$, $Ge_2Sb_2Te_5$, $Ge_1Sb_2Te_4$, $Ge_1Sb_4Te_7$, etc., among other phase change materials. The hyphenated chemical composition notation, as used herein, indicates the elements included in a particular mixture or compound, and is intended to represent all stoichiometries involving the indicated elements. Other phase change materials can include Ge—Te, In—Se, Sb—Te, Ga—Sb, In—Sb, As—Te, Al—Te, Ge—Sb—Te, Te—Ge—As, In—Sb—Te, Te—Sn—Se, Ge—Se—Ga, Bi—Se—Sb, Ga—Se—Te, Sn—Sb—Te, In—Sb—Ge, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Sb—Se—Te, Ge—Sn—Sb—Te, Ge—Te—Sn—Ni, Ge—Te—Sn—Pd, and Ge—Te—Sn—Pt, for example.

Embodiments are not limited to storage elements comprising phase change materials. For instance, the storage elements can comprise one or more variable resistance materials such as binary metal oxides, colossal magnetoresistive materials, and/or various polymer-based resistive variable materials, among others.

In a number of embodiments, the select devices corresponding to cells 102 can be ovonic threshold switches (OTSs) comprising a chalcogenide material 114 formed between electrodes 112 and 116. In such embodiments, the chalcogenide material 114 of the select device may not actively change phase, e.g., between amorphous and crystalline, such as a chalcogenide material 110 of the resistive storage element. However, the chalcogenide 114 of the select device can change between an "on" and "off" state depending on the voltage potential applied across the phase change memory cell 102. The state of the OTS can change when a current through the OTS exceeds a threshold current or a voltage across the OTS exceeds a threshold voltage. Once the threshold current or voltage is reached, the on state is triggered and the OTS can be in a conductive state. If the current or voltage potential drops below a threshold value, the OTS can return to a non-conductive state.

In a number of embodiments, the resistive storage element material 110 can comprise one or more of the same material(s) as the select device material 114. However, embodiments are not so limited. For example, the resistive storage element material 110 and the select device material 114 can comprise different materials.

FIGS. 2-1A through 2-12C illustrate cross sectional views of various process stages associated with forming a memory array in accordance with a number of embodiments of the present disclosure. In each of the sets of figures that follow, e.g., 2-1, 2-2, etc., each figure is a cross section in a unique one of the three dimensions. Figure B of each set is cross-sectional view taken along the cut line B-B shown in the corresponding Figures A and C. Figure A of each set is cross-sectional view taken along cut line A-A shown in the corresponding Figures B and C. Figure C of each set is cross-sectional view taken along cut line C-C shown in the corresponding Figures A and B. For example, Figure A of each set can be a cross-sectional top view of an array structure at a particular point of forming, Figure B of each set can be a cross-sectional side view of an array structure at the particular point of forming shown in the corresponding Figures A and C, and Figure C of each set can be a cross-sectional end view of an array structure at the particular point of forming shown in the corresponding Figures A and B.

Multiple patterning is a class of technologies for manufacturing integrated circuits (ICs), developed for photolithography to enhance the feature density. The simplest case of multiple patterning is double patterning, where a conventional lithography process is enhanced to produce double the expected number of features. While the following description refers to double patterning technique as an example of multiple patterning techniques, embodiments of the present disclosure are not limited to the double patterning technique, and can be implemented using other types of multiple patterning techniques. Double patterning lithography (DPL) is the enabling technology for printing sub-32 nm nodes. Self-aligning multiple patterning (SAMP), such as self-aligning double patterning (SADP, first patterns and forms dense lines, and subsequently trims away the portions of those lines, such as an end portion, not on the design. Portions of the dense lines can be trimmed away using a cut mask, for example.

Figures 1A, 2:
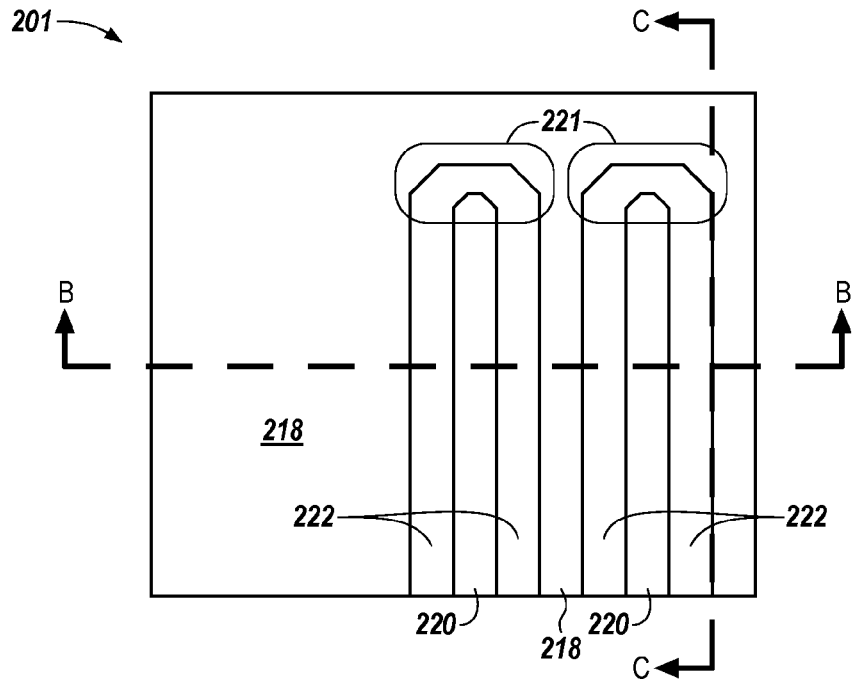
FIGS. 2-1A through 2-12C illustrate cross sectional views of various process stages associated with forming a memory array in accordance with a number of embodiments of the present disclosure.

FIG. 2-1A shows a cross-sectional view of an array structure 201 having SADP patterns, used for forming conductive lines, e.g., word lines, formed over a masking material 218. Core material 220 is formed with a regular pitch of four times the feature size, i.e., 4F, for example, by the following example process. First of all the core material 220 is deposited overall and then patterned with a relaxed mask to get both width and spacing at double the minimum feature size, i.e., 2F. This implies a regular pitch, e.g., of the core material 220, with total size of 4F. Then, keeping the initial 4F pitch, a trimming process can squeeze the width of the core material 220 to a smaller size, e.g., about F, with an increased of spacing, e.g., 3F, therebetween. The spacer material 222 is formed around the core material 220. As is shown, the spacer material 222 forms a closed-end, e.g., "U," shape, around the ends of the core material 220 atop a masking material 218. This closed-end shape is referred to herein as a looped feature, e.g., loop 221.

The spacer material 222 is formed on the sidewall(s) of the pre-patterned features defined by the core material 220. A spacer can be formed, for example, by deposition or reaction of the film on the previous pattern of the core material 220, followed removal, such as by etching, of the core material 220, leaving only the spacer material 222 on the sidewalls. By removing the original patterned feature of core material 220, only the spacer material 222 is left. However, since there are two features, e.g., lines, of spacer material 222 for every feature of core material 220, the spacer material 222 line density is double that of the core material 220 line density so that the distance between spacer material 222 lines is the feature size, i.e., 1F, or less. As previously mentioned, embodiments of the present disclosure are not limited to double patterning techniques, and the spacer material 222 can be used in implementing other multiple patterning techniques to further increase the line density. The spacer technique is applicable for defining various features such as conductive lines, e.g., word lines and/or bit lines, at half the original lithographic pitch, for example.

One consideration with respect to the above-described spacer material 222 approach is whether the material(s) of the feature below the spacer material 222, e.g., feature stack such as a word line stack, will stay in place after the material(s) around the feature are removed, particularly during removal of a portion of the feature, such as by a chop etch. In some instances, the chop etch can distort and/or move the feature due to a "waggling" effect, for example.

Figures 1B, 2:
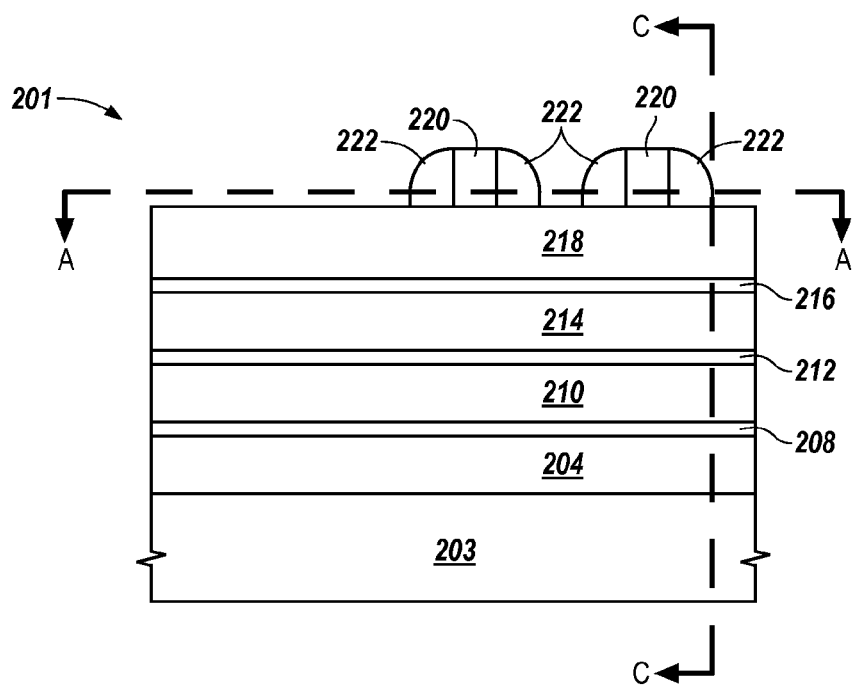
Figures 1C, 2:
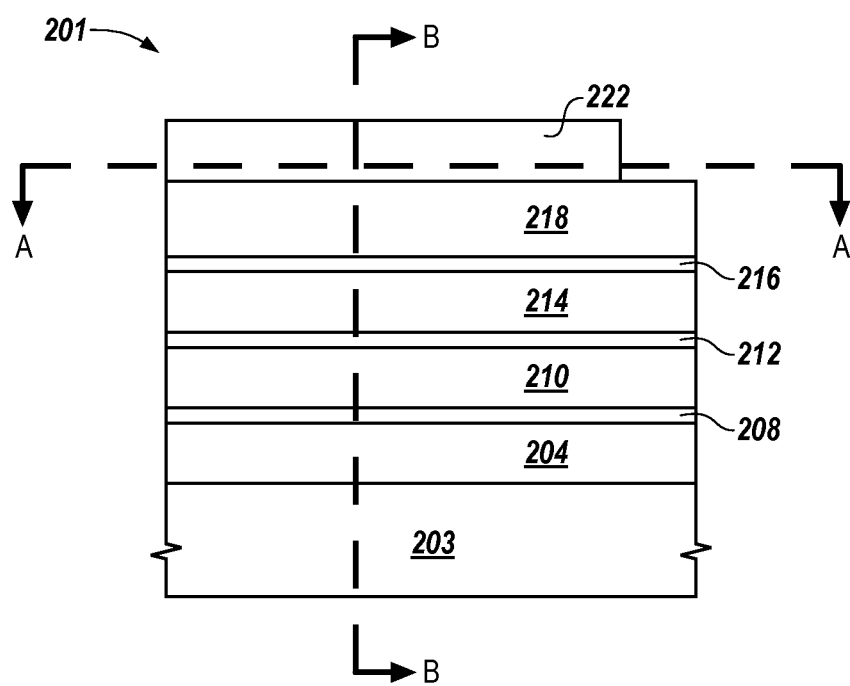

FIG. 2-1B shows the material formed between the masking material 218 and the substrate 203, which can include circuitry (not shown), e.g., decode circuitry formed therein. The substrate 203 can be a silicon substrate comprising a number of doped and/or undoped semiconductor materials, for instance. FIGS. 2-1B and 2-1C show a first conductive material 204 formed over the substrate 203. The conductive material 204 can be used to form conductive lines, e.g., word lines and/or bit lines, of array structure 201 and can comprise a metal such as tungsten, for example. Although not shown in FIGS. 2-1A-2-12C, a dielectric material such as a nitride material and/or oxide material can be formed on substrate 203, e.g., between conductive material 204 and substrate 203. A electrode material 208 can be formed over the conductive material 204. The electrode material 208 can comprise carbon, for example, and can serve as a bottom electrode for a select device or resistive storage element for memory cells of array structure 201.

A storage element material 210, such as a phase change material (PCM) can be formed over the electrode material 208, and an electrode material 212 can be formed over the storage element material 210. The electrode material 212 can serve as a middle electrode between the storage element material 210 and a select device material 214, and can comprise a same or different electrode material than electrode material 208. For example, the electrode material 212 can comprise carbon. The select device material 214 can comprise, for instance, an OTS material and can be formed over the electrode material 212. An electrode material 216 can be formed over the select device material 214 and can serve as a top electrode for a select device or resistive storage element for memory cells of array structure 201.

The electrode material 216 can comprise a same or different electrode material than the electrode material 208 and/or the electrode material 212. For example, the electrode material 216 can comprise carbon. In this example, the select device material 214 is formed between electrode materials 212 and 216 and the resistive storage element material 210 is formed between electrode materials 208 and 212. However, embodiments are not so limited. For instance, in a number of embodiments, select device material 216 can be formed between electrode materials 208 and 212, and resistive storage element material 210 can be formed between electrode materials 212 and 216. The masking material 218 can be formed over the electrode material 216. The masking material 218 can be a hard mask, such as silicon nitride (SiN), for example.

As shown in FIGS. 2-1B and 2-1C, the core material 220 and spacer material 222 used to pattern features, such as conductive lines, e.g., word lines, associated with array structure 201 can be formed over a material stack. In embodiments in which the materials 220 and 222 are used to pattern word lines of array structure 201, the material stack can be referred to as a "word line stack." In this example, the word line stack comprises conductive material 204, electrode material 208, storage element material 210, electrode material 212, select device material 214, electrode material 216, and masking material 218.

The materials described herein may be formed by various techniques including, but not limited to, spin coating, blanket coating, chemical vapor deposition (CVD) such as low pressure CVD or plasma enhanced CVD, plasma enhanced chemical vapor deposition (PECVD), atomic layer deposition (ALD), plasma enhanced ALD, physical vapor deposition (PVD), thermal decomposition, and/or thermal growth, among others. Alternatively, materials may be grown in situ. While the materials described and illustrated herein may be formed as layers, the materials are not limited thereto and may be formed in other three-dimensional configurations.

Figures 2, 2A:
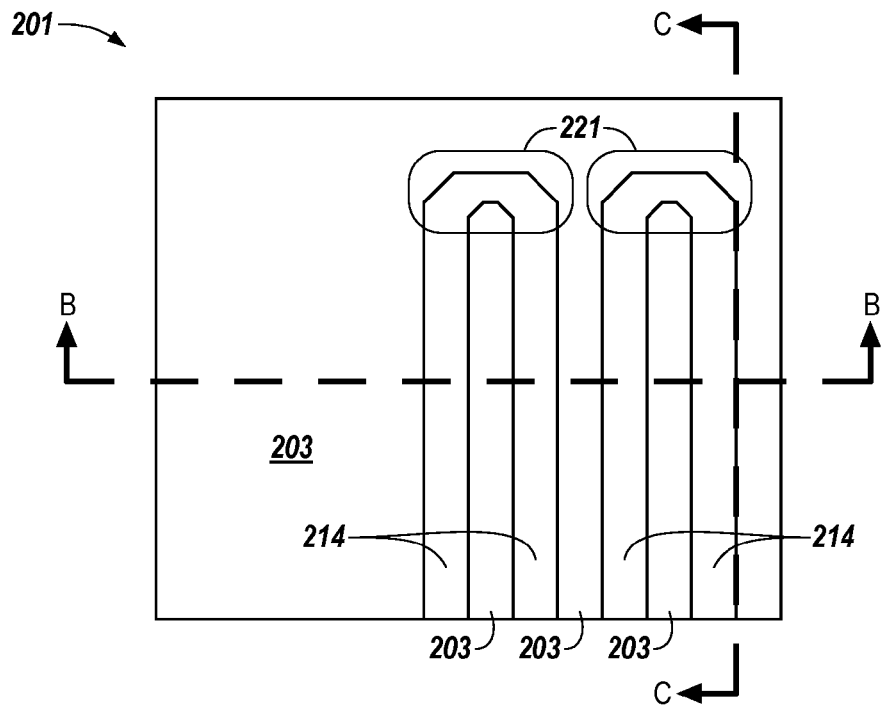
Figures 2, 2B:
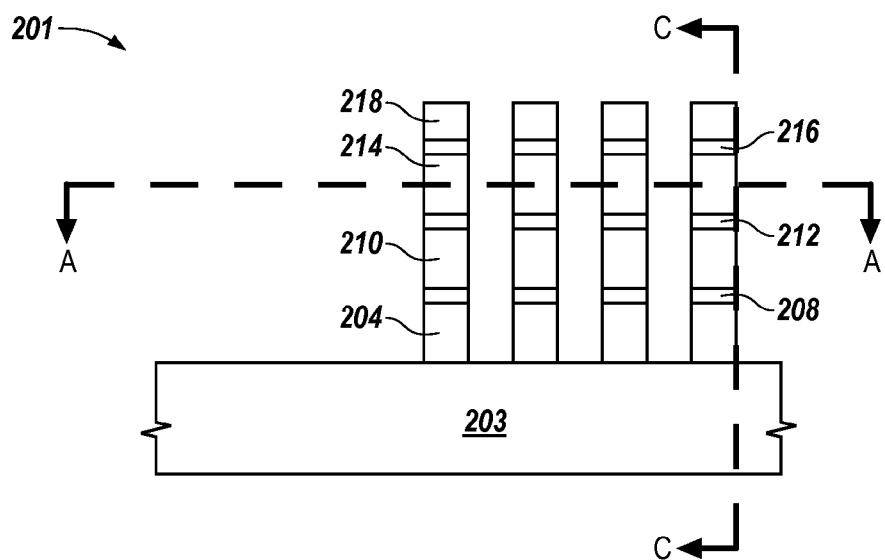
Figures 2, 2C:
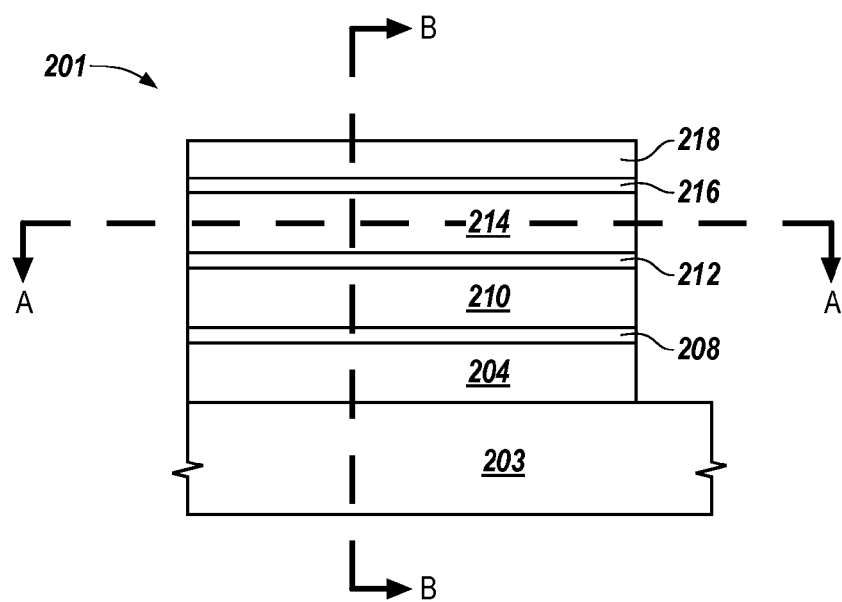

FIG. 2-2A/B/C show the array structure 201 after additional processing with respect to that shown in FIGS. 2-1A/B/C. FIG. 2-2A illustrates definition of conductive lines, e.g., word lines 204, by etching the material stack shown in FIGS. 2-1A/B/C. That is, those portions of the conductive material 204, the electrode material 208, the storage element material 210, the electrode material 212, the select device material 214, the electrode material 216, and the masking material 218 not located beneath spacer material 222 have been removed, e.g., by an etch process, such that substrate 203 is exposed. FIGS. 2-2B and 2-2C show the core material 220, and the spacer material 222 used to define word lines, 204 having also been removed, leaving the separate word lines 204.

According to previous approaches, an additional mask, i.e., a chop mask, is used to pattern the loops 221 for chopping in order to form individual word lines. That is, the "U" shaped portion of the word line stack can be removed to disconnect the corresponding two word lines by application of a chop mask and additional material removal process, e.g., etch. According to previous approaches, the chop mask and chop etch was implemented to cut the loops 221 before etching out the word-line stack. However, the process of the previous approach chop etch can cause the remaining lines to distort and/or move. Such distortions and/or movement becomes more problematic as feature size decreases, and can result in unwanted shorts between the remaining lines.

According a number of embodiments of the present disclosure, mitigation of distortion and/or movement of features can be accomplished, in part, by stabilizing features of the array structure 201 being chopped to make them more rigid, such as by sealing the features. That is, features, e.g., loops 221, are better anchored within the array structure 201, and gaps between features, e.g., loops 221, are filled-in with supporting materials in contrast to previous SADP approaches where features, e.g., loops 221, are etched at the spacer level thereby exposing the features, e.g., loops 221, to the possibility of a "waggling" effect, e.g., movement, during the chop etch.

With better precision of feature definition and location, and the mitigation of the "waggling" effect during chopping, more compact layouts can be formed. For example, there can be less risk of shorting between features, e.g., conductive lines, where the location and configuration of the features, e.g., conductive lines, is more precisely controlled by the mitigation of distortion and/or movement of the features, e.g., conductive lines. Furthermore, sockets previously used in cross-point arrays can be reduced and/or eliminated where locations of conductive lines can be more accurately aligned with underlying vias according to methods of the present disclosure.

Figures 2, 3, 3A:
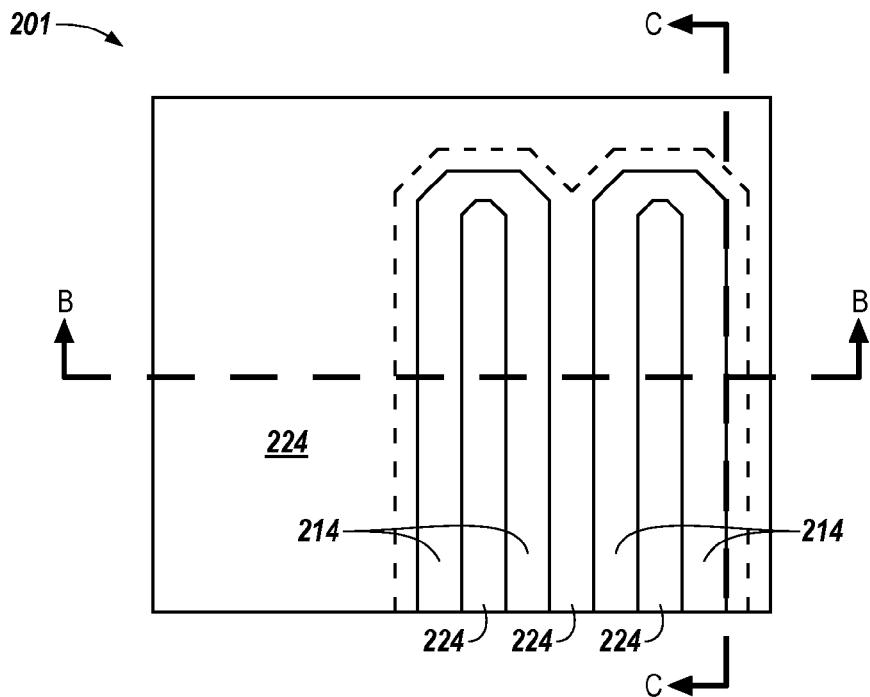

FIG. 2-3A/B/C show the array structure 201 after additional processing with respect to that shown in FIGS. 2-2A/B/C. According to various embodiments of the present disclosure, and in contrast to previous approaches, the word lines 204 can be sealed before cutting the loops 221, e.g., by a chop etch. For example, a sealing material 224 can be formed over the array structure shown in FIGS. 2-2A/B/C. The sealing material 224 can be conformally formed over the array structure, for example, by an atomic layer deposition (ALD) process. FIGS. 2-3A and 2-3C show that the sealing material 224 can also be formed over exposed portions of the substrate 203 and mask material 218.

Figures 2, 3, 3B:
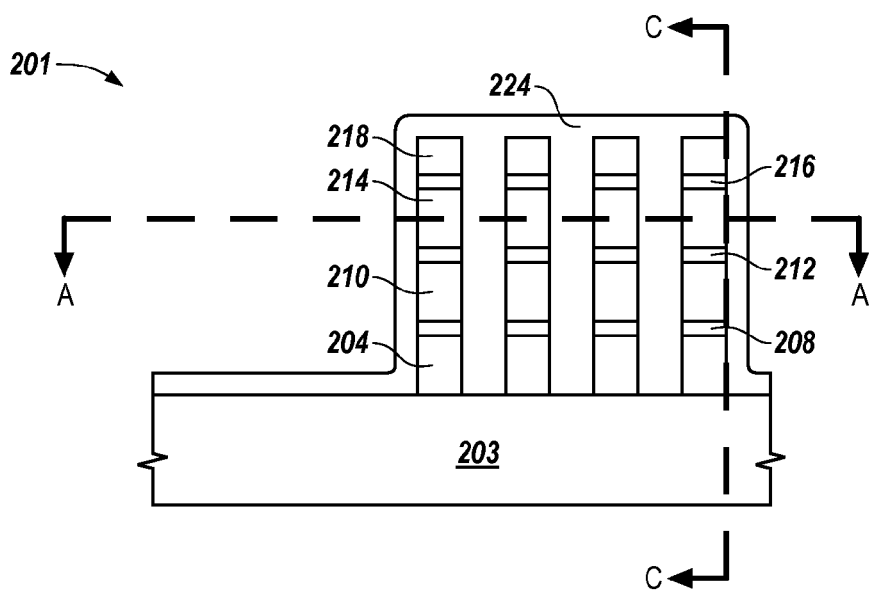
Figures 2, 3, 3C:
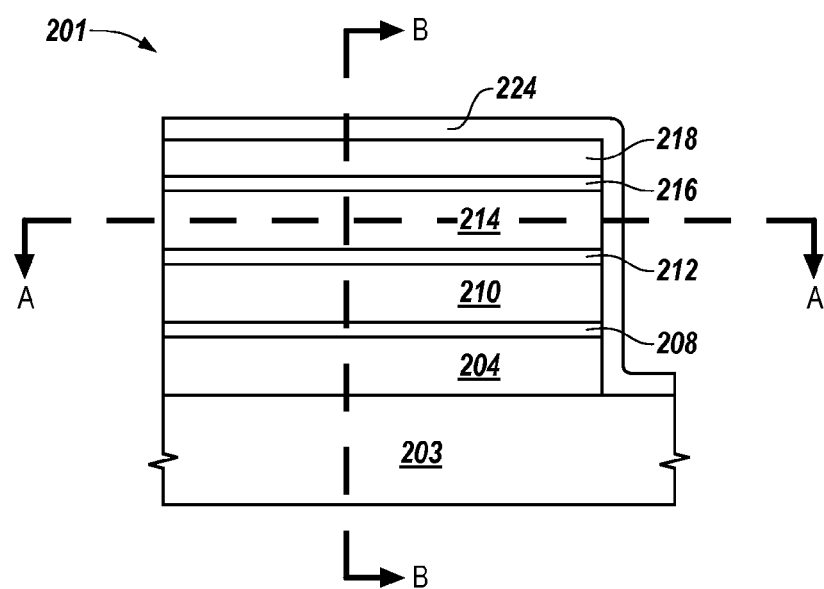

FIG. 2-3B shows that the sealing material 224 can be formed so as to substantially fill the areas between the word lines 204. That is, the elevation of the sealing material 224 between the word lines 204 is the same as the elevation of the sealing material 224 on the mask material 218. While FIG. 2-3B shows that the sealing material 224 can be formed so as to substantially fill the areas between the word lines 204, embodiments of the present disclosure are not so limited. That is, the sealing material 224 can be formed such that it partially fills, rather than completely and/or substantially fill, the areas between adjacent conductive lines, e.g., word lines and/or bit lines. In this manner, partially filling the areas between adjacent conductive lines can nevertheless strengthen the particular conductive line rigidity and thereby reduce waggling.

FIGS. 2-4A/B/C show the array structure 201 after additional processing with respect to that shown in FIGS. 2-3A/B/C. FIGS. 2-4A/B/C show a chop mask material 226 having been formed over a portion of the sealing material 224. The chop mask material 226 can be formed over portions of the array structure 201 that are not intended to be removed via a chop etch. As such, the chop mask material 226 is not formed, or is formed and subsequently removed, over the regions of the structure 201 that include ends of the loops 221 (shown in FIG. 2-1A), e.g., as indicated by the exposed portions of sealing material 224 in FIGS. 2-4A and 2-4C.

After the chop mask material 226 is formed over the sealing material 224 (except in the chop region 228), the chop mask material 226 can be appropriately treated, e.g., hardened, so as to form a chop mask. Alternatively, a spin-on dielectric (SOD) material (not shown in figures), e.g., an oxide material, can be formed over the chop region 228 and/or the chop mask material 226 so as to fill gaps and improve planarity of the resulting array structure 201. The SOD oxide material (not shown in figures) can be planarized to a elevation that reveals again the chop mask material 226, such that the chop region 228 is filled with the SOD oxide material (not shown in figures) to a same elevation as the chop mask material 226 so as to improve the quality of a subsequent removal process, e.g., chop etch, that includes removing the ends of the loops 221.

FIGS. 2-5A/B/C show the array structure 201 after additional processing with respect to that shown in FIGS. 2-4A/B/C. FIGS. 2-5A/B/C show the array structure 201 after the removal process, e.g., chop etch, that includes removing the loops 221, and removal of the chop mask material 226 so as to leave individual word lines 204, e.g., parallel word lines without the looped ends. That is, materials in an area of the loops 221 have been cut away to form individual parallel word lines 204. The chop mask material 226 is also removed following the chop etch, such that the sealing material 224 is exposed.

FIGS. 2-6A/B/C show the array structure 201 after additional processing with respect to that shown in FIGS. 2-5A/B/C. FIGS. 2-6A/B/C show a sealing material 225 formed over the array structure 201, including over the sealing material 224 and the substrate 203 shown in FIGS. 2-5A/B/C. The sealing material 225 can be conformally formed over the array structure 201 such as by ALD, for example. In this manner, the sealing material 225 can protect the ends of the word lines 204 previously cut by the chop etch.

FIGS. 2-6A/B/C also show a sealing material 227 formed over the sealing material 225. The sealing material 227 can be, for example, a SOD oxide material used to fill gaps and improve planarity of the resulting array structure 201. That is, the SOD oxide material can be planarized, e.g., by a chemical-mechanical polishing/planarization (CMP) process, to a uniform elevation suitable for further processing of the array structure 201 in completing a cross-point array, for instance.

FIGS. 2-7A/B/C through FIGS. 2-12A/B/C describe formation of the bit lines subsequent to formation of the word lines 204 as described above. FIGS. 2-7A/B/C show the array structure 201 after additional processing with respect to that shown in FIGS. 2-6A/B/C. FIGS. 2-7A/B/C show the array structure 201 after a planarization process, such as by CMP. The planarization process can remove portions of the sealing materials 225, 227, and 224, as well as masking material 218. The planarization process can stop on the electrode material 216, for instance.

FIGS. 2-8A/B/C show the array structure 201 after additional processing with respect to that shown in FIGS. 2-7A/B/C. FIGS. 2-8A/B/C show a conductive material 206, e.g., from which the bit lines will be formed, formed over the planarized array structure 201 shown in FIGS. 2-7A/B/C. The conductive material 206 can be tungsten, for example. FIGS. 2-8A/B/C further show a masking material 232 formed over the conductive material 206. Masking material 232 can be silicon nitride, for example.

Over the masking material 232, the bit line layout can be defined by a SADP technique, for example, in a similar manner as was previously described for the word line layout. However, the bit line layout can be oriented perpendicular to the word lines. The bit line layout is defined by a core material 236 being formed over the masking material 232 and spacer material 234 being formed around the core material 236. As is shown, the spacer material 234 forms a closed-end, e.g., "U," shape, around the ends of the core material 236 atop the masking material 232. Again, this closed-end shape is referred to herein as a looped feature, e.g., loop 231.

To complete formation of individual bit lines, the loops 231 will be cut off, along with the conductive material 206 beneath. This can be accomplished in a manner similar to that previously described for the word line formation.

FIGS. 2-9A/B/C show the array structure 201 after additional processing with respect to that shown in FIGS. 2-8A/B/C. FIGS. 2-9A/B/C show the results of a material removal process, e.g., bit line etch, to form the self-aligned bit lines 206. As shown, the material removal process can stop at the elevation of the word lines 204, which results in pillars including the electrode material 208, the storage element material 210, the electrode material 212, the select device material 214, and the electrode material 216 at intersection of lines of the word lines 204 and loops 231 of the conductive material 206. While FIGS. 2-9A/B/C show the material removal process removing all of the masking material 232 and stopping at the elevation of the word lines 204, embodiments of the present disclosure are not so limited and the material removal process can be stopped before reaching the word lines 204 so that some of the masking material 232 can be left on top of the word lines 204.

FIGS. 2-10A/B/C show the array structure 201 after additional processing with respect to that shown in FIGS. 2-9A/B/C. According to various embodiments of the present disclosure, and in contrast to previous approaches, the bit line stacks can be sealed before cutting the loops 231, e.g., prior to a chop etch. For example, a sealing material 238 can be formed over the structure in FIGS. 2-9A/B/C. The sealing material 238 can be conformally formed over the structure by an ALD process, for instance. FIGS. 2-10A and 2-10C show that the sealing material 238 can be formed over the word lines 204, the sealing material 225, and the sealing material 227. The sealing material 238 can be formed so as to substantially fill the areas between the pillars. That is, the elevation of the sealing material 238 between the pillars can be the same as the elevation of the sealing material 238 on the bit lines 206.

FIGS. 2-11A/B/C show the array structure 201 after additional processing with respect to that shown in FIGS. 2-10A/B/C. FIGS. 2-11A/B/C show a chop mask material 240 formed over a portion of the sealing material 238. The chop mask material 240 can be formed over portions of the array structure 201 that are not intended to be removed via a chop etch. As such, the chop mask material 240 is not formed, or is formed and subsequently removed, over the regions of the structure 201 that include the loops 231 (shown in FIG. 2-8A), e.g., as indicated by the exposed portions of sealing material 238 in FIGS. 2-11A and 2-11B.

After the chop mask material 240 is formed over the sealing material 238 (except in the chop region 239), the chop mask material 240 can be appropriately treated, e.g., hardened, to form a chop mask. Alternatively, a SOD oxide material (not shown in figures) can be formed over the chop region 239 and/or the chop mask material 240 so as to fill gaps and improve planarity of the resulting array structure 201. The SOD oxide material (not shown in figures) can be planarized to a elevation that reveals again the chop mask material 240, such that the chop region 239 can be filled with the SOD oxide material (not shown in figures) to a same elevation as the chop mask material 240 so as to improve the quality of a subsequent removal process, e.g., chop etch, that includes removing the loops 231 (shown in FIG. 2-8A).

FIGS. 2-12A/B/C show the array structure 201 after additional processing with respect to that shown in FIGS. 2-11A/B/C. FIGS. 2-12A/B/C show the array structure 201 after the removal process, e.g., chop etch, that includes removing the loops 231 (shown in FIG. 2-8A), and removal of the chop mask material 240 so as to leave individual bit lines 206 that no longer have loops 231 (shown in FIG. 2-8A). That is, the loops 231 (shown in FIG. 2-8A) have been cut away to form individual parallel bit lines 206.

FIGS. 2-12A/B/C also show a sealing material 242 formed over the array structure 201, including over the sealing material 238 and the materials left exposed by the chop etch of the bit line stack. The sealing material 242 can be conformally formed, such as by ALD, for example, so as to protect the ends of the bit lines 206 previously cut by the chop etch. Further processing can be performed to complete the formation of a cross-point array. For instance, connections, e.g., by conductive plugs, of conductive lines, e.g., word lines and/or bit lines, to decode circuitry formed in the substrate 203.

As one of ordinary skill in the art will appreciate, a memory array can be coupled to various circuitry which is not shown in the preceding figures for sake of clarity. Such circuitry can include decode circuitry, control circuitry, and write circuitry, among other circuitry associated with operating a memory array such as array 100 shown in FIG. 1. Circuitry can refer to conductive material, e.g., metal, and devices, among other structures. Embodiments of the present disclosure are not limited to a particular type of array or array architecture.

Some advantages of the methods described with respect to FIG. 2-1A to 2-12C include mitigating distortion and/or movement of features such as conductive lines, e.g., word lines, bit lines, during a chop etch to loops, e.g., 221, 231, that may be formed by use of a SADP technique. Mitigation of distortion and/or movement of features can be accomplished, in part, by sealing features and thereby making the features more rigid prior to chopping away some portion thereof, e.g., by a chop etch. That is, features can be anchored within the array structure, and gaps between features can be filled with supporting materials, prior to a chop etch, in contrast to previous SADP approaches.

As fill be further appreciated, a high density memory array can be obtained using a cross-point architecture. SADP techniques can enable $4F^2$ cell density, where F is the technology feature size, e.g., spacing between word and/or bit lines. Even greater density can be obtained by stacking to achieve a memory cell density of $4F^2/n$, where n is the quantity of stacked array instances. For example, a multi-layer, e.g., 3 dimensional, cross-point memory array can be formed by stacking two arrays "back-to-back" between two word line metal materials, with a bit line metal material located between the stacked arrays, the bit lines being shared by the two arrays. Methods of the present disclosure can be applied to additional stacked array instances.

FIG. 3 illustrates an example conductive line layout and chop mask orientation associated with an array formed in accordance with a number of embodiments of the present disclosure. Forming certain features using SADP for PCMS cross-point array architectures includes management of word line and bit line decoding that involves two peculiar issues when compared to NAND memory arrays. First, there is not any "spare space" to be gained from the equivalent of source selection regions, as in NAND control gates decoding. Second, the definition of word lines and bit lines is subtractive (and not damascene, as for NAND tungsten bit lines), in order to integrate the array with the minimum number of masks.

FIG. 3 shows a layout of conductive lines 348 of an array region 350 interface with one or more adjacent socket regions 352. A socket region 352 is an area within which conductive lines, e.g., word lines and/or bit lines, interface with other elevations of an array structure. Interconnections can be made by conductive plugs formed in vias between various elevations, for instance. A socket region 352 can also provide additional area on a particular elevation in which to allow more space, e.g., as compared to within the array region 350, between conductive lines and/or vias.

In previous approaches, such additional spacing between conductive lines 348 allow room for the conductive lines 348 room to move and/or allow room for distortions in the conductive lines 348, during formation of the array structure, such as during a chop etch as the loops were being cut off, for example. Therefore, a chop etch corresponding to the chop regions 354 (on one side of the array region 350) and 355 (on an opposite side of the array region 350) can leave the conductive lines 348 sufficiently spaced apart to avoid shorting therebetween. However, where a chop etch can be accomplished with less movement and/or distortion of the conductive line 348, such as by the methods of the present disclosure, socket regions can be designed to have smaller size.

The conductive lines 348 may initially be arranged having a loop at each end of adjacent conductive lines 348. That is, the conductive lines 348 can have bends 353 therein outside the array region 350, e.g., in the socket region 352. The conductive lines 348 may be arranged such that innermost loops 358 on one side of the array region 350, e.g., in a first socket region, correspond to the outermost loops 360 on an opposite side of the array region 350, e.g., in a second socket region. The conductive lines 348 within the socket regions 352 can be arranged to have more space therebetween, as compared to the array region 350. The ends of the conductive lines 348, after the loops are removed by the chop etch, also interface with vias 356 in order to connect to conductive features, e.g., metal lines, at other elevations. That is, the conductive lines 348 align with the vias 356 in the socket region 352 after the chop etch.

Conductive lines 348 that are moved or distorted as a result of a chop etch can result in defects due to problems depositing dielectric materials between moved and/or distorted conductive lines. Movement and/or distortion of conductive lines by a chop etch can change the spacing therebetween. Where such spacing is increased slightly, conformal, e.g., ALD, dielectric materials are formed over the features may not completely fill larger gaps. However, a slightly larger gap may also be too small to be filled with less-conformal dielectrics, which can cause a defect, e.g., seam, to form in the dielectric and lead to memory array failures.

Figures 2, 3, 4, 4A:
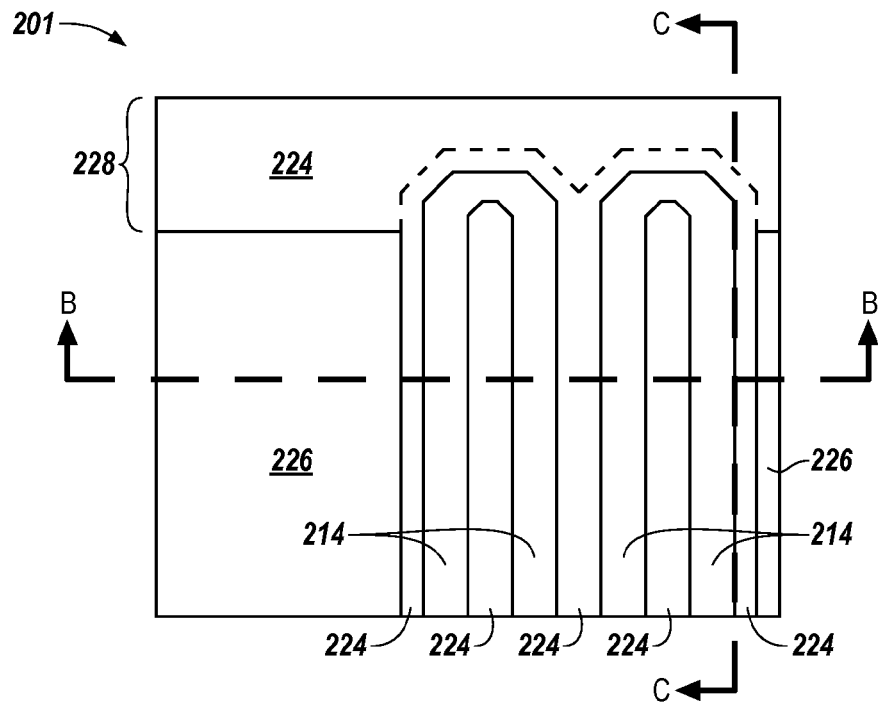
Figures 2, 3, 4, 4B:
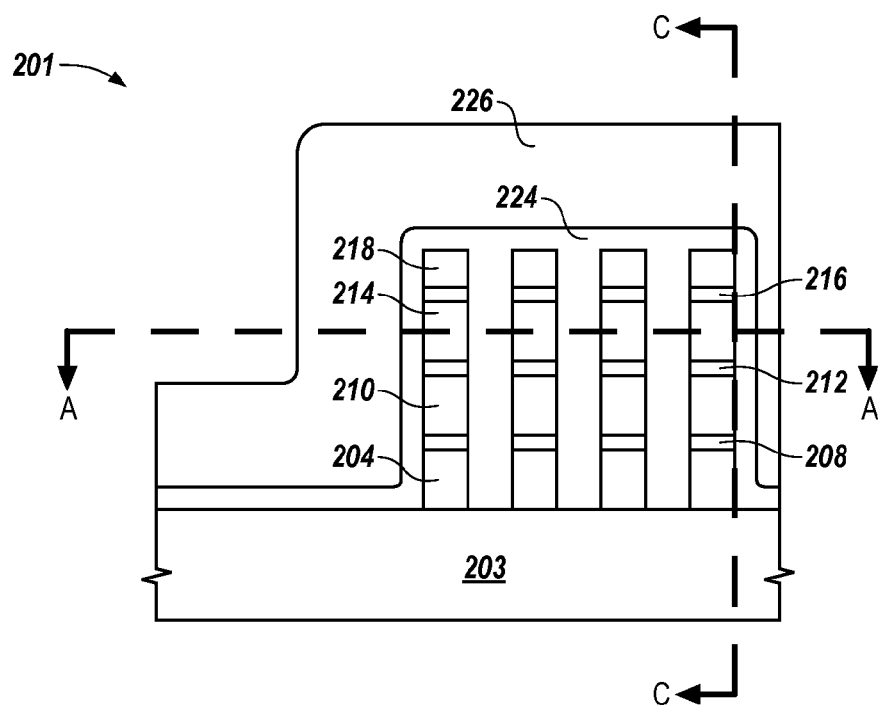
Figures 2, 3, 4, 4C:
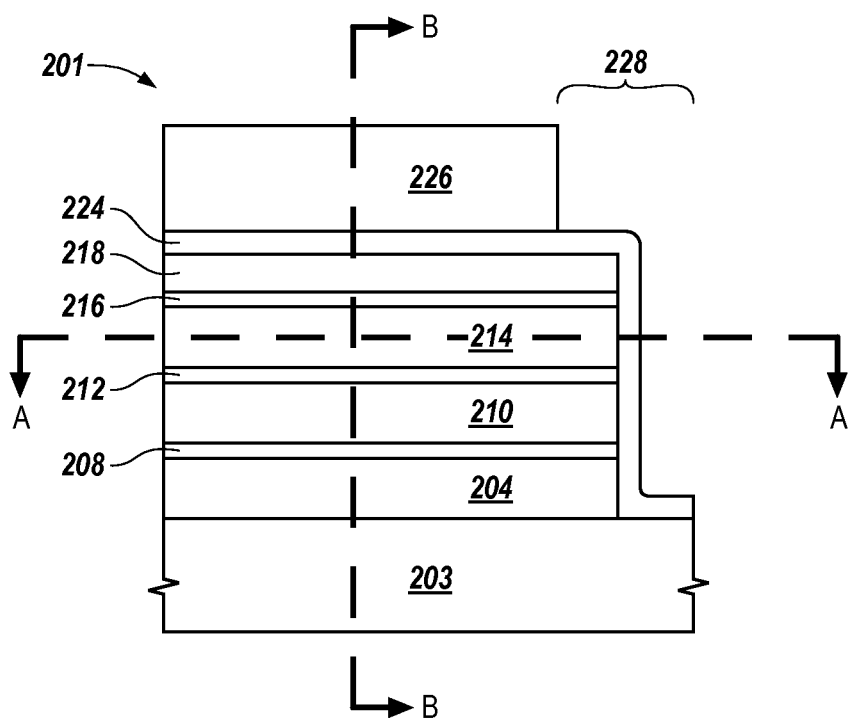
Figures 2, 3, 4, 5, 5A:
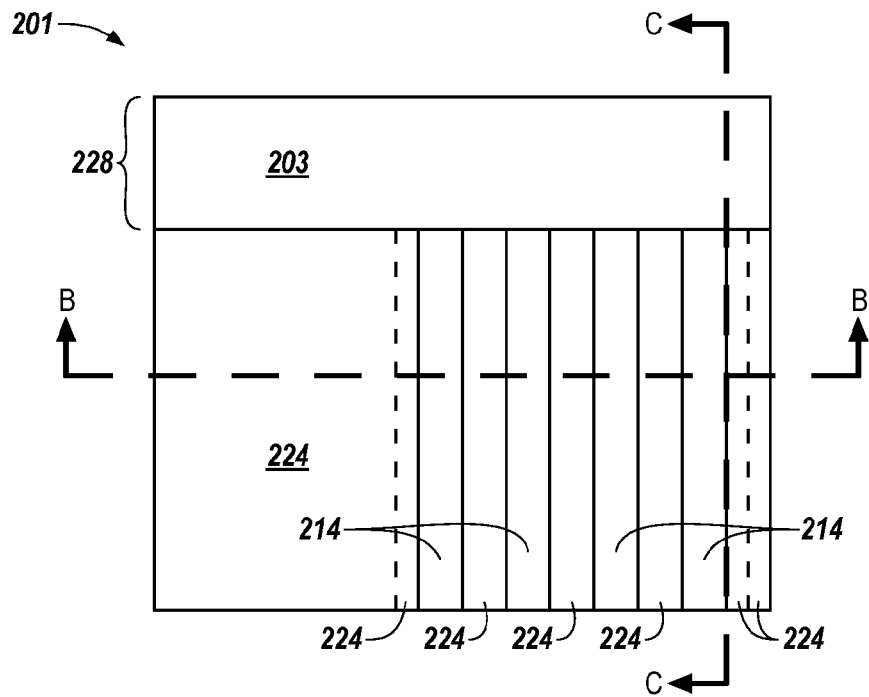
Figures 2, 3, 4, 5, 5B:
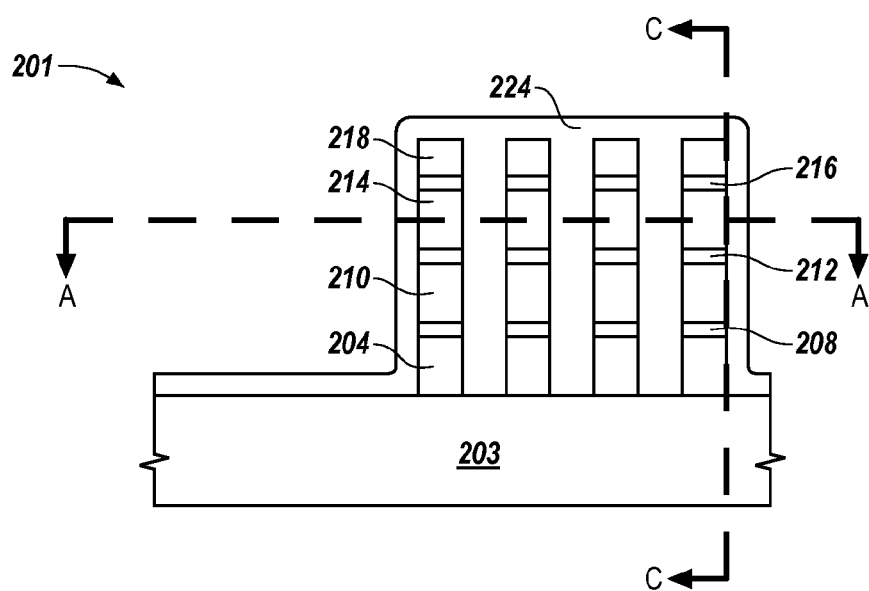
Figures 2, 3, 4, 5, 5C:
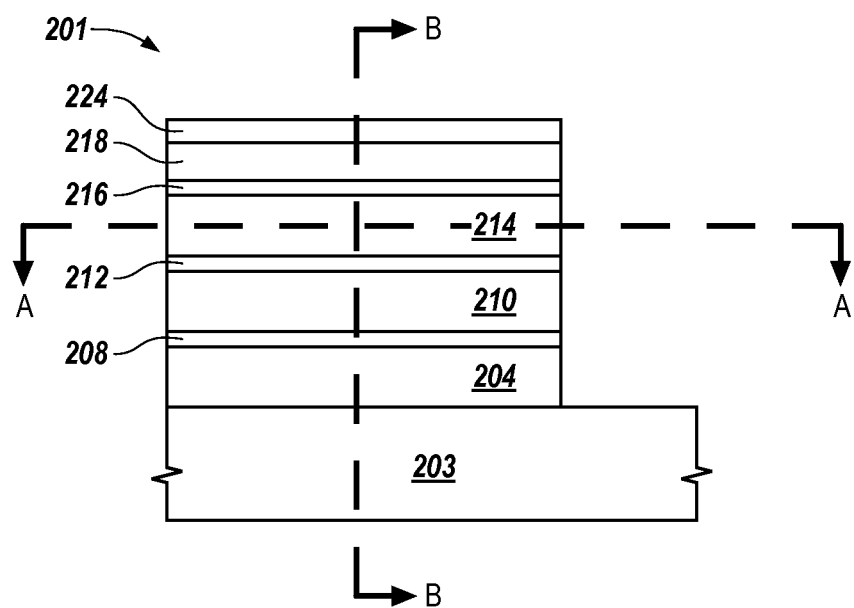
Figures 2, 3, 4, 5, 6, 6A:
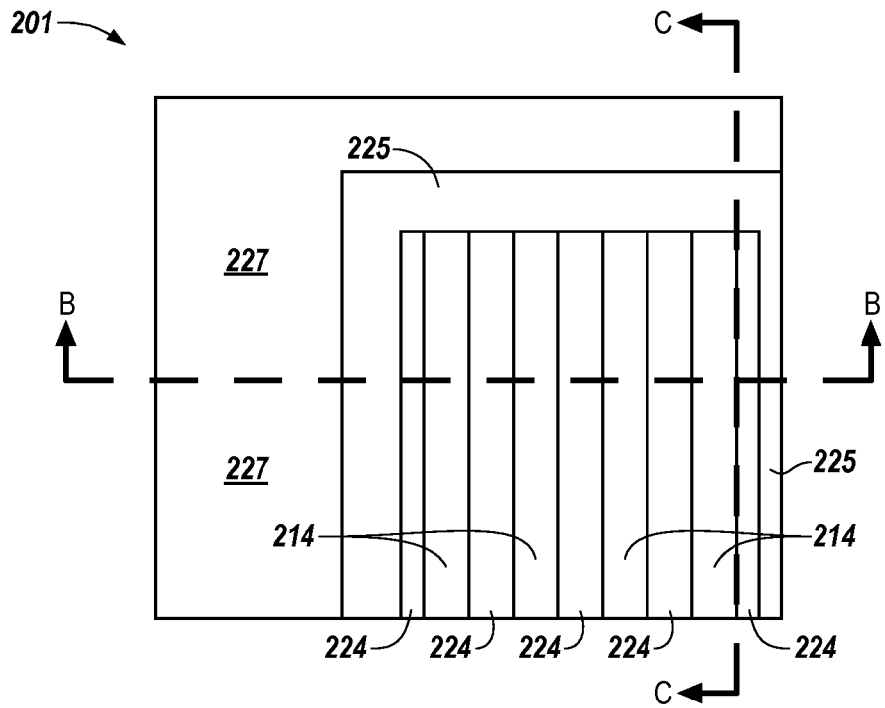
Figures 2, 3, 4, 5, 6, 6B:
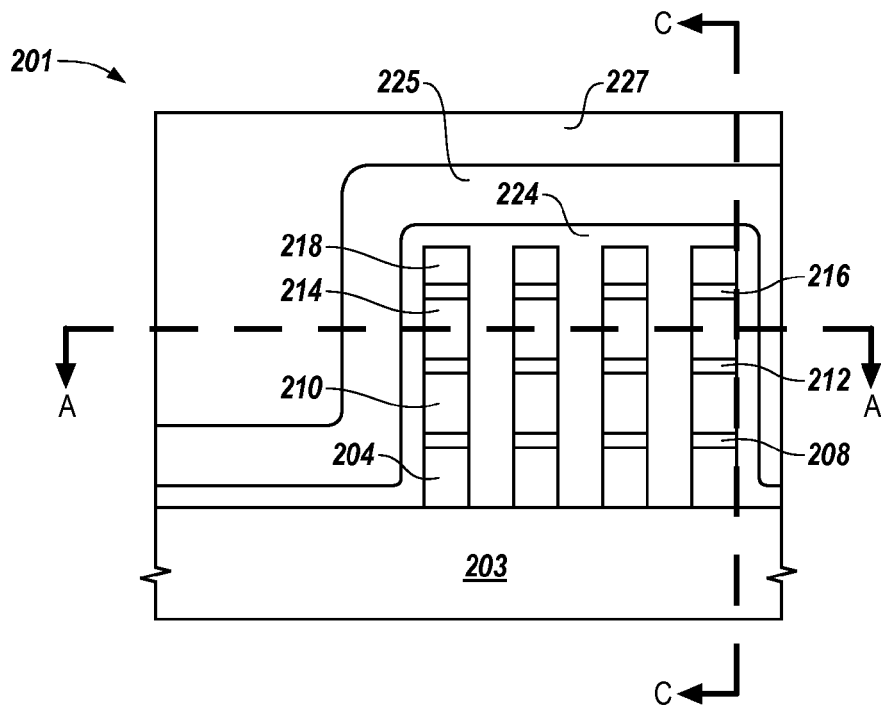
Figures 2, 3, 4, 5, 6, 6C:
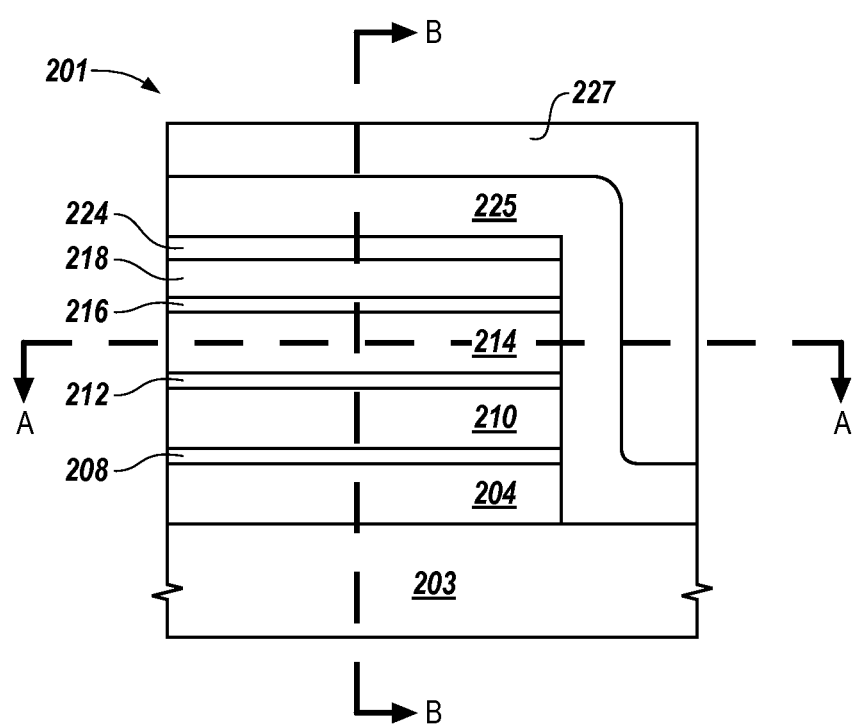
Figures 2, 3, 4, 5, 6, 7, 7A:
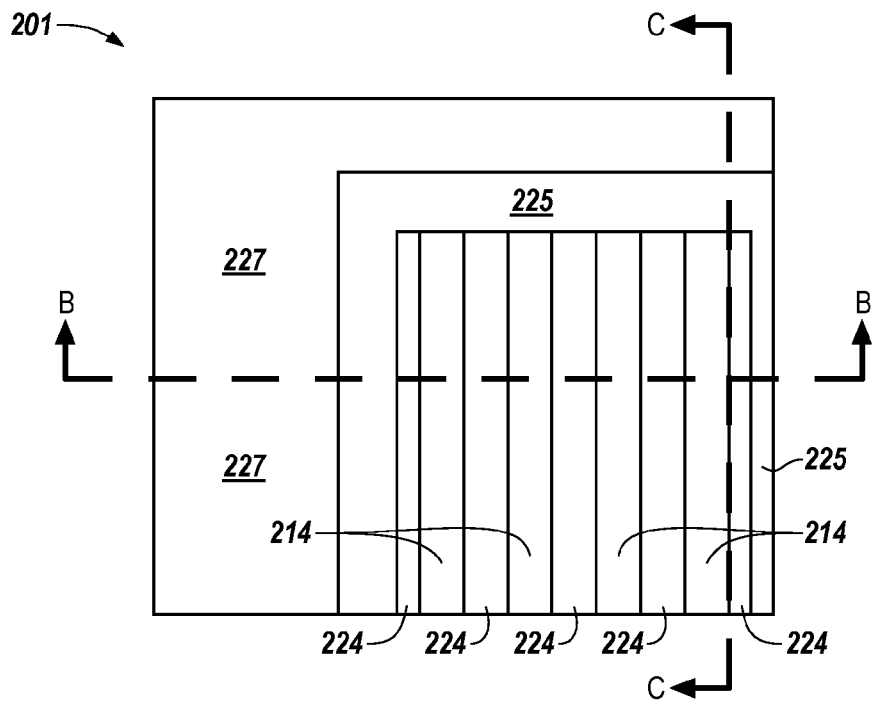
Figures 2, 3, 4, 5, 6, 7, 7B:
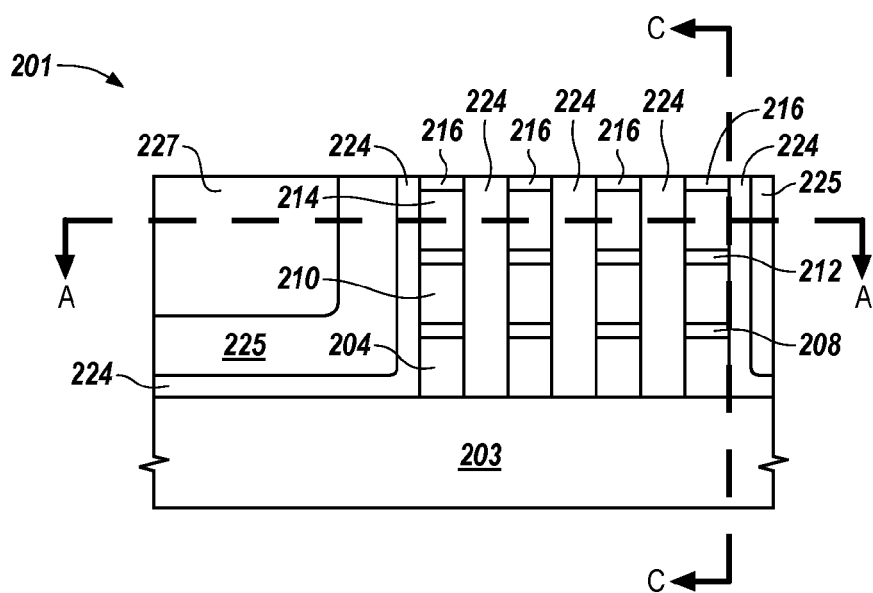
Figures 2, 3, 4, 5, 6, 7, 7C:
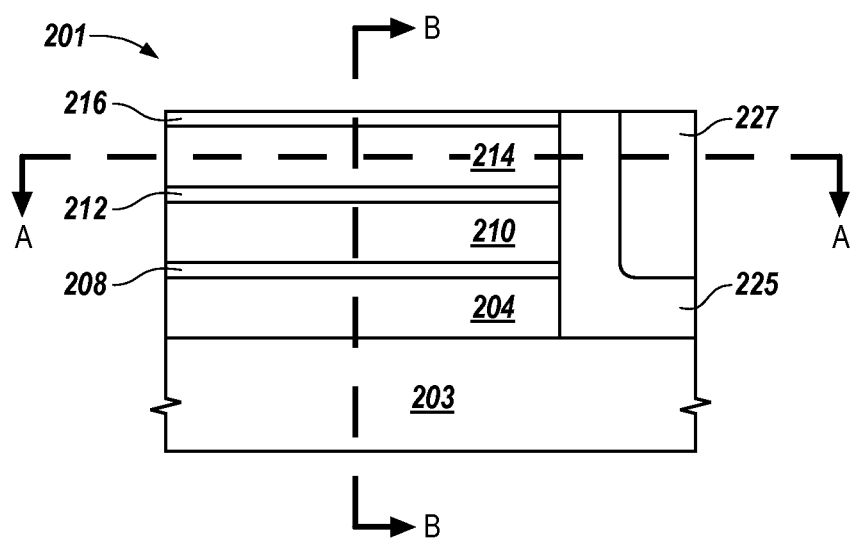
Figures 2, 3, 4, 5, 6, 7, 8, 8A:
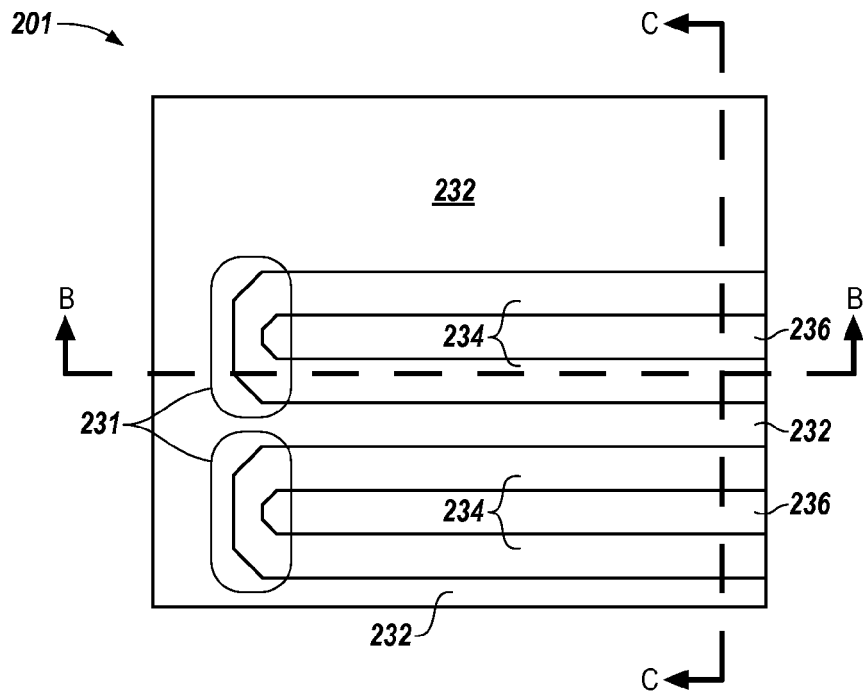
Figures 2, 3, 4, 5, 6, 7, 8, 8B:
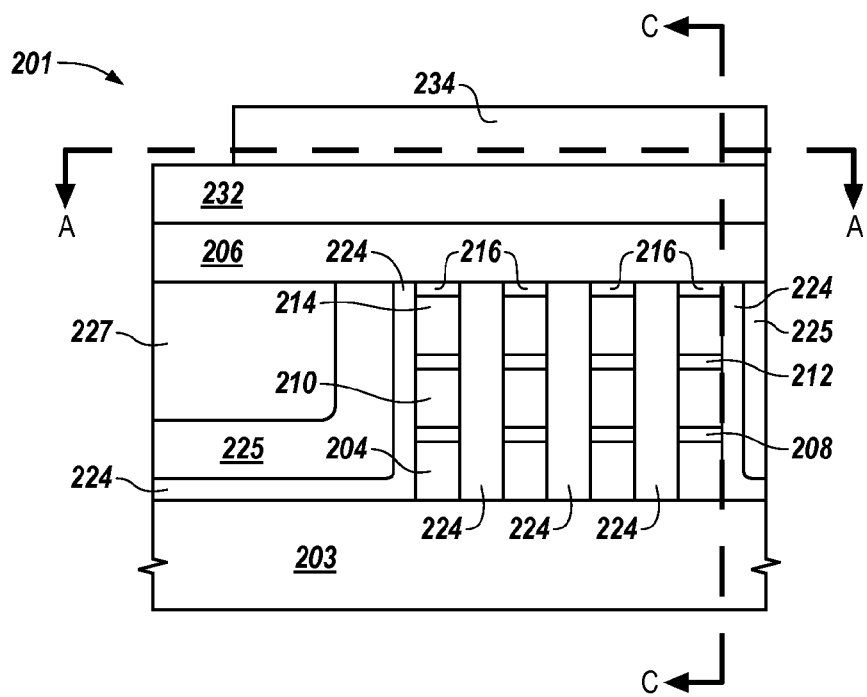
Figures 2, 3, 4, 5, 6, 7, 8, 8C:
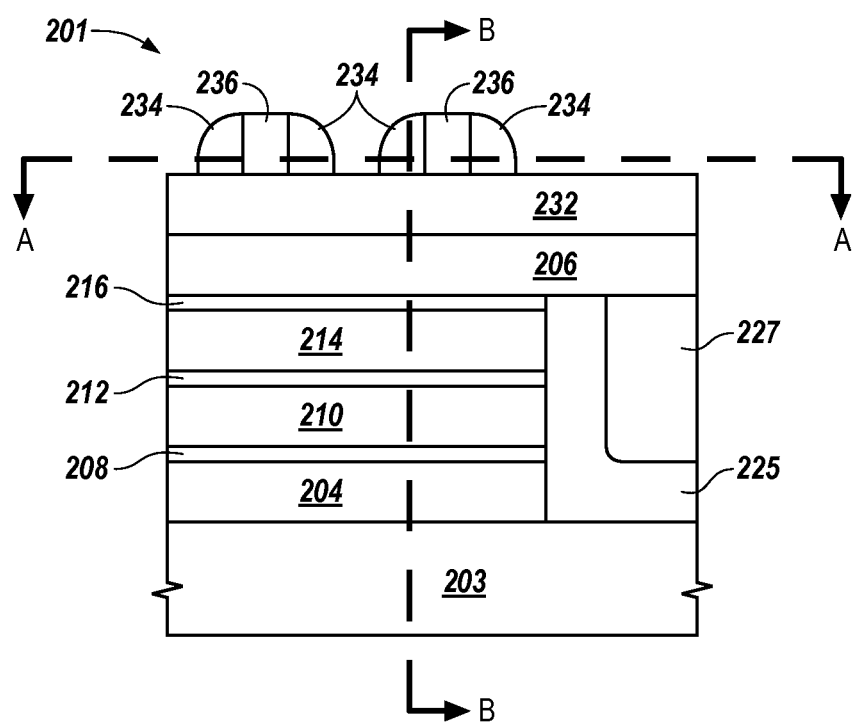
Figures 2, 3, 4, 5, 6, 7, 8, 9, 9A:
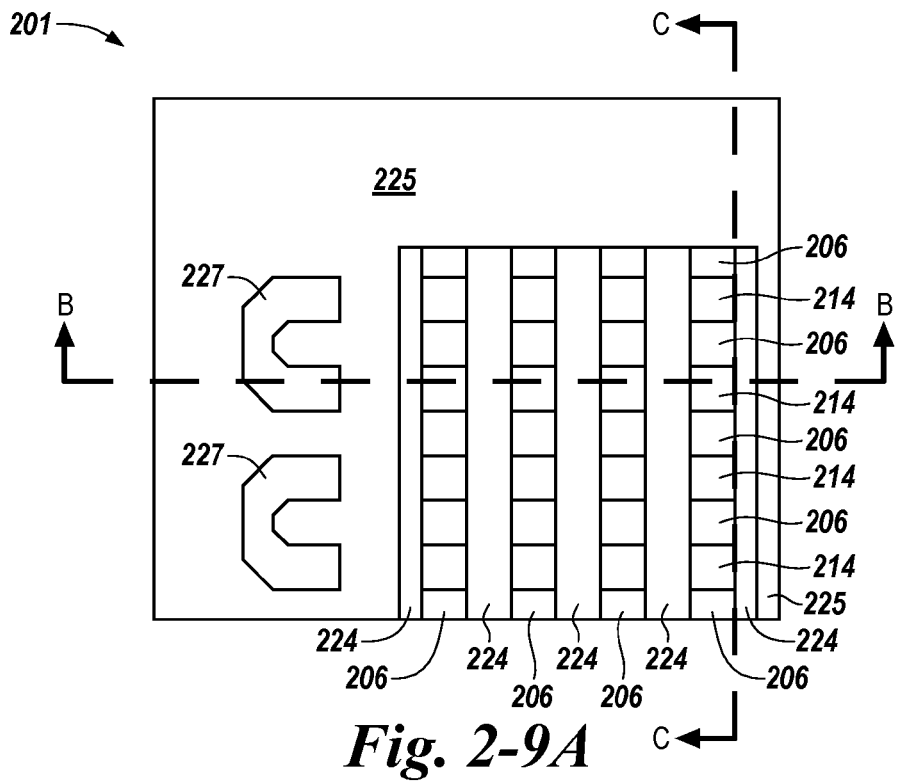
Figures 2, 3, 4, 5, 6, 7, 8, 9, 9B:
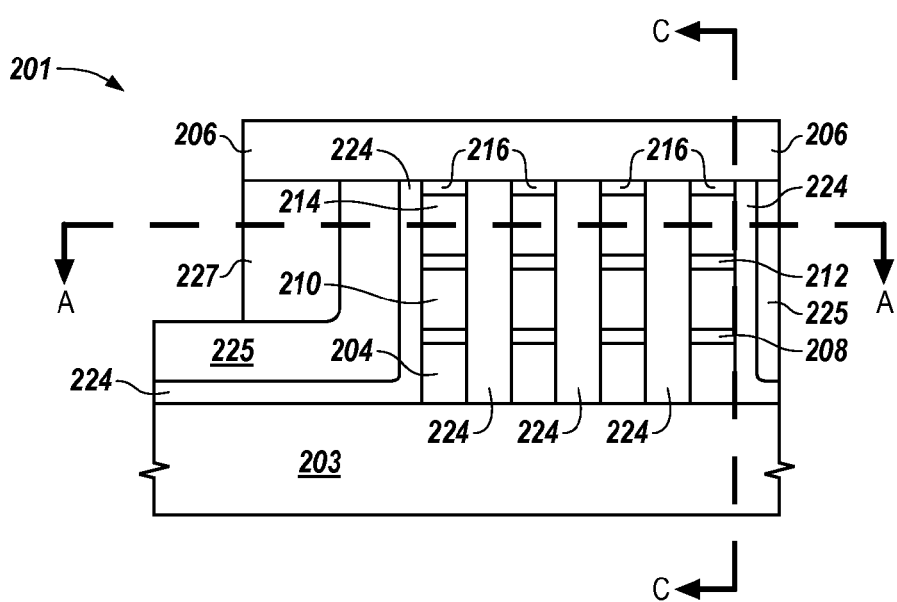
Figures 2, 3, 4, 5, 6, 7, 8, 9, 9C:
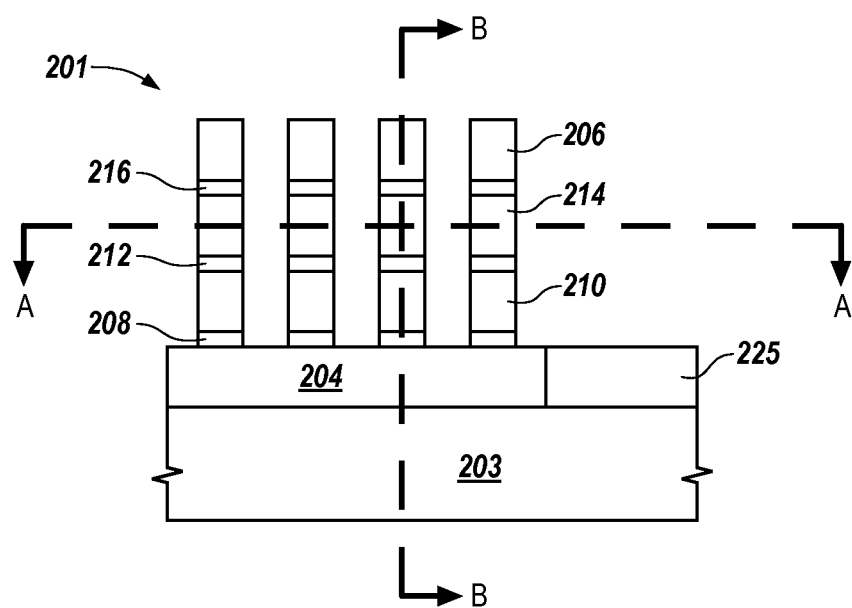
Figures 2, 3, 4, 5, 6, 7, 8, 9, 10, 10A:
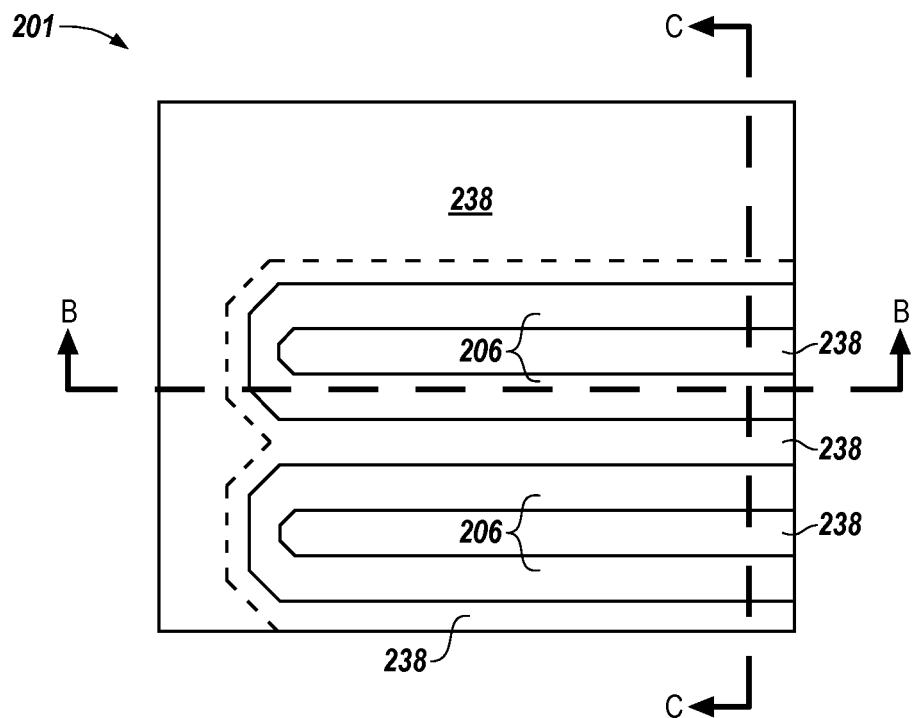
Figures 2, 3, 4, 5, 6, 7, 8, 9, 10, 10B:
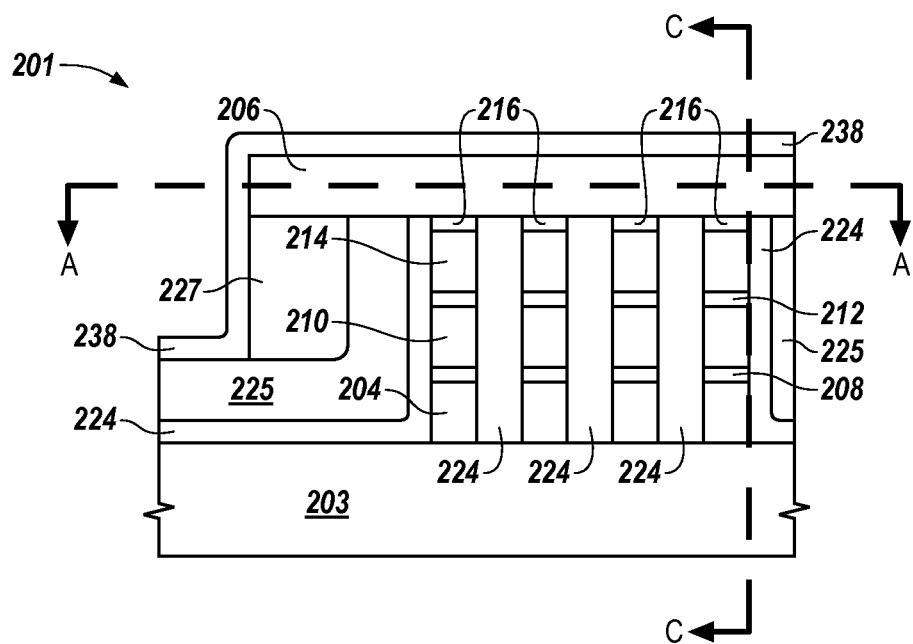
Figures 2, 3, 4, 5, 6, 7, 8, 9, 10, 10C:
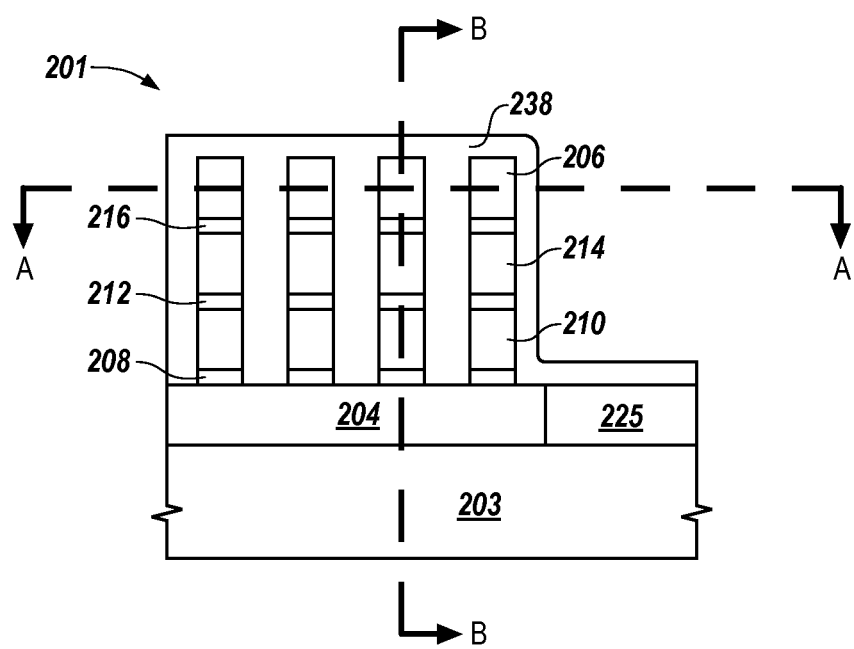
Figures 2, 3, 4, 5, 6, 7, 8, 9, 10, 11, 11A:
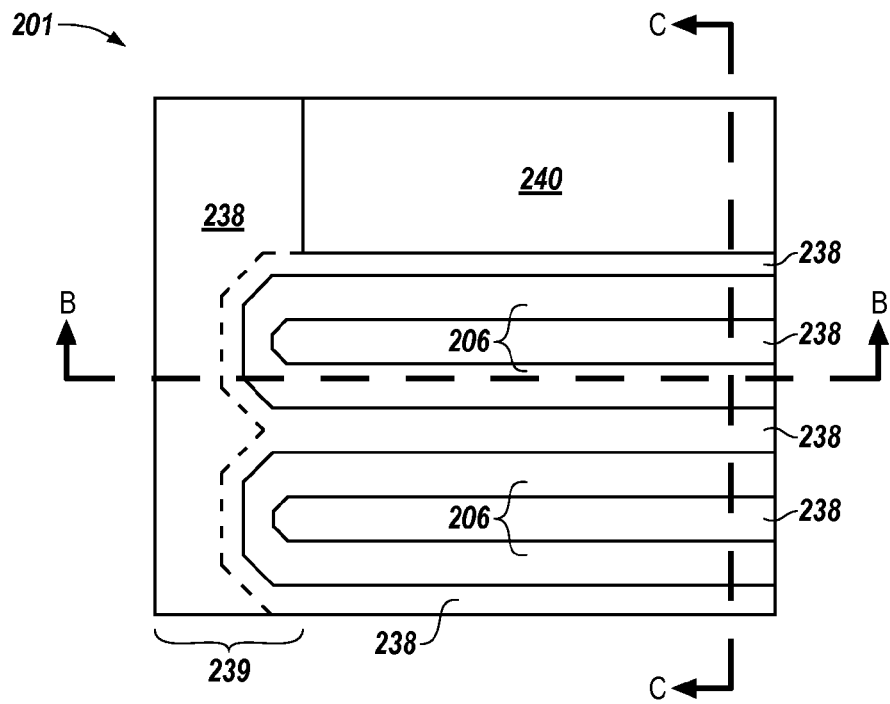
Figures 2, 3, 4, 5, 6, 7, 8, 9, 10, 11, 11B:
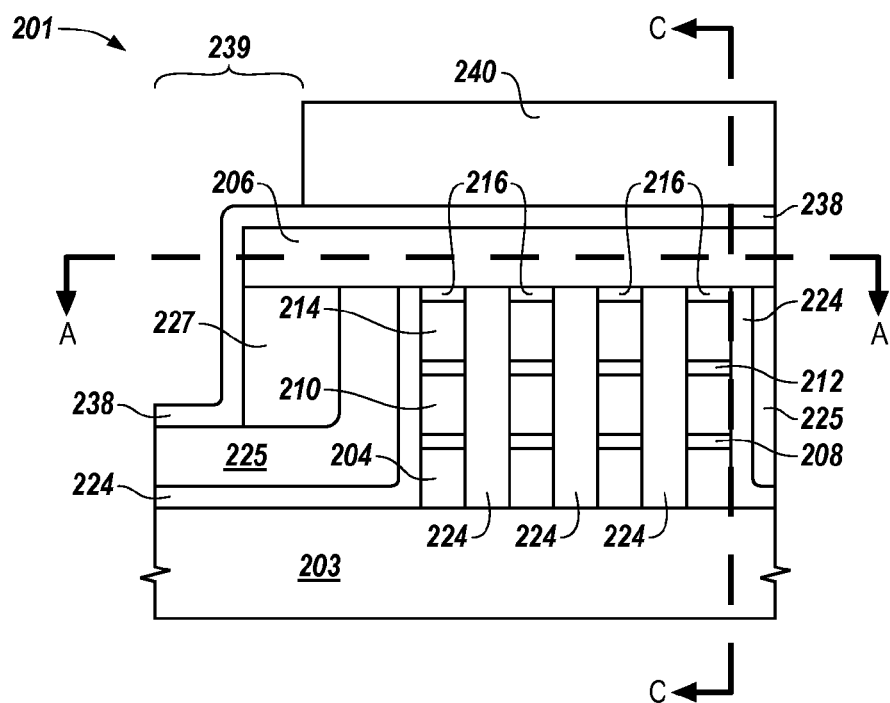
Figures 2, 3, 4, 5, 6, 7, 8, 9, 10, 11, 11C:
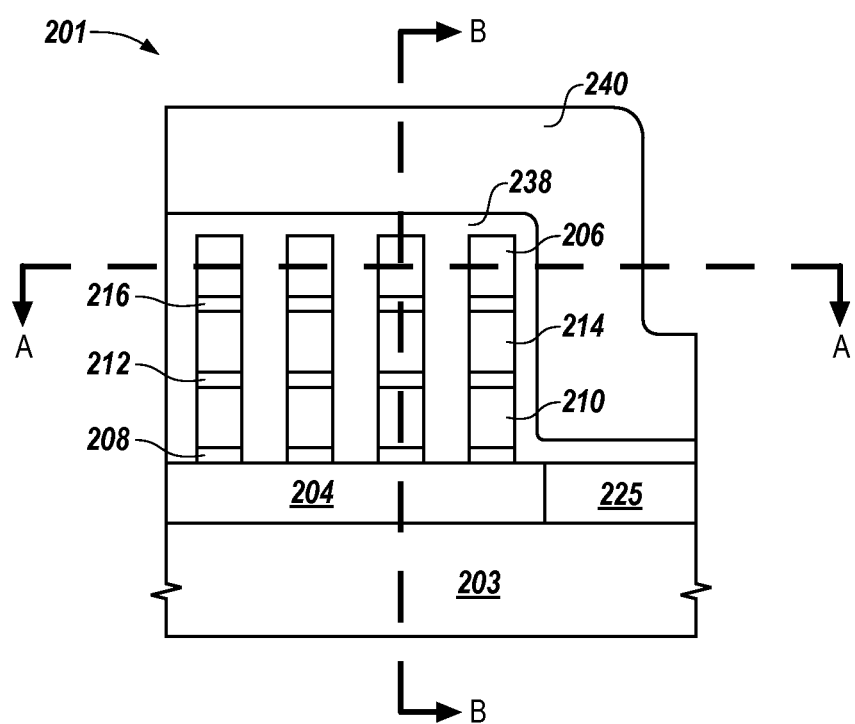
Figures 2, 3, 4, 5, 6, 7, 8, 9, 10, 11, 12, 12A:
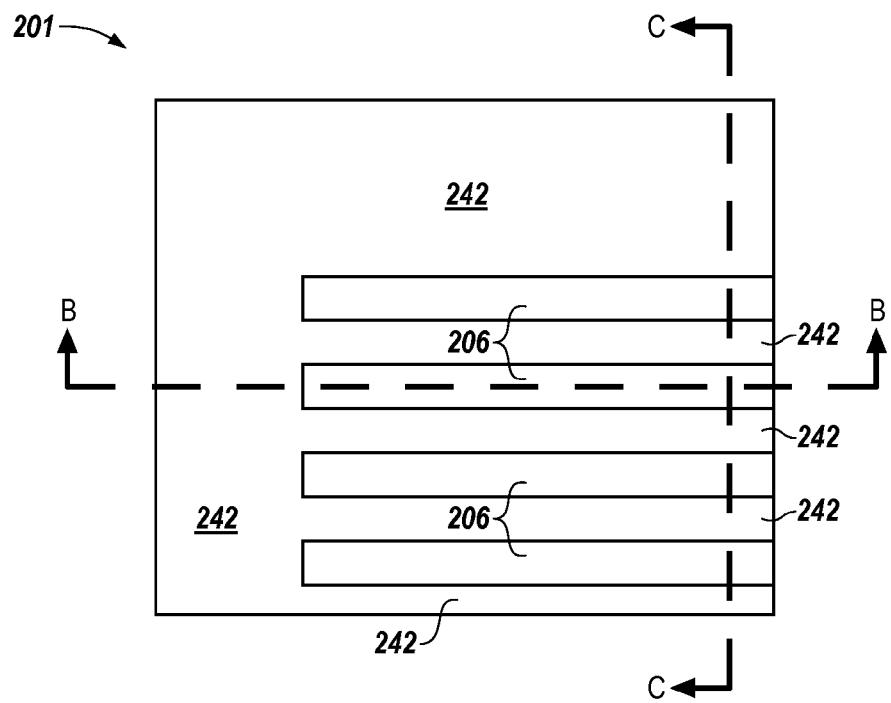
Figures 2, 3, 4, 5, 6, 7, 8, 9, 10, 11, 12, 12B:
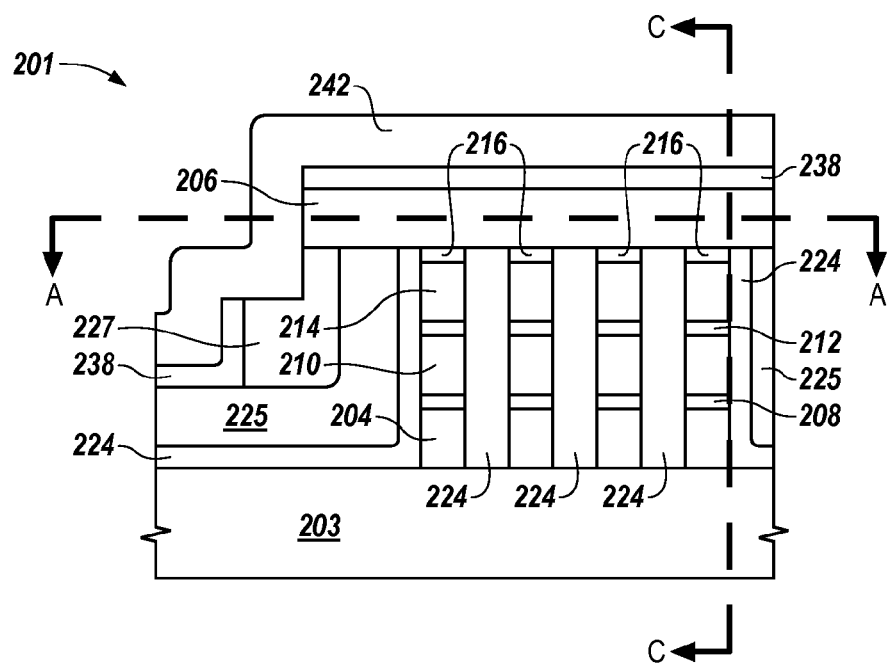
Figures 2, 3, 4, 5, 6, 7, 8, 9, 10, 11, 12, 12C:
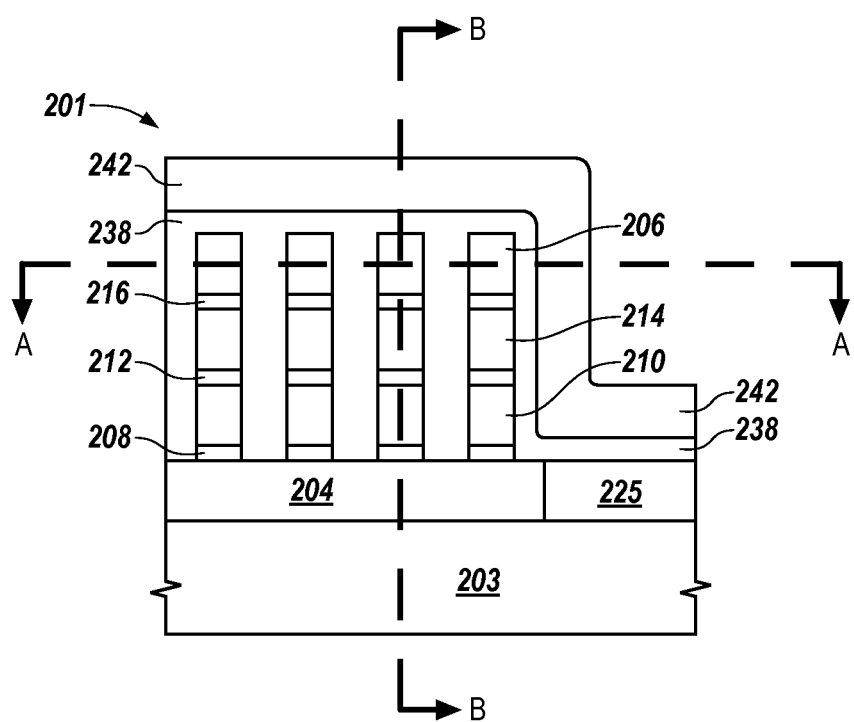
Figure 3:
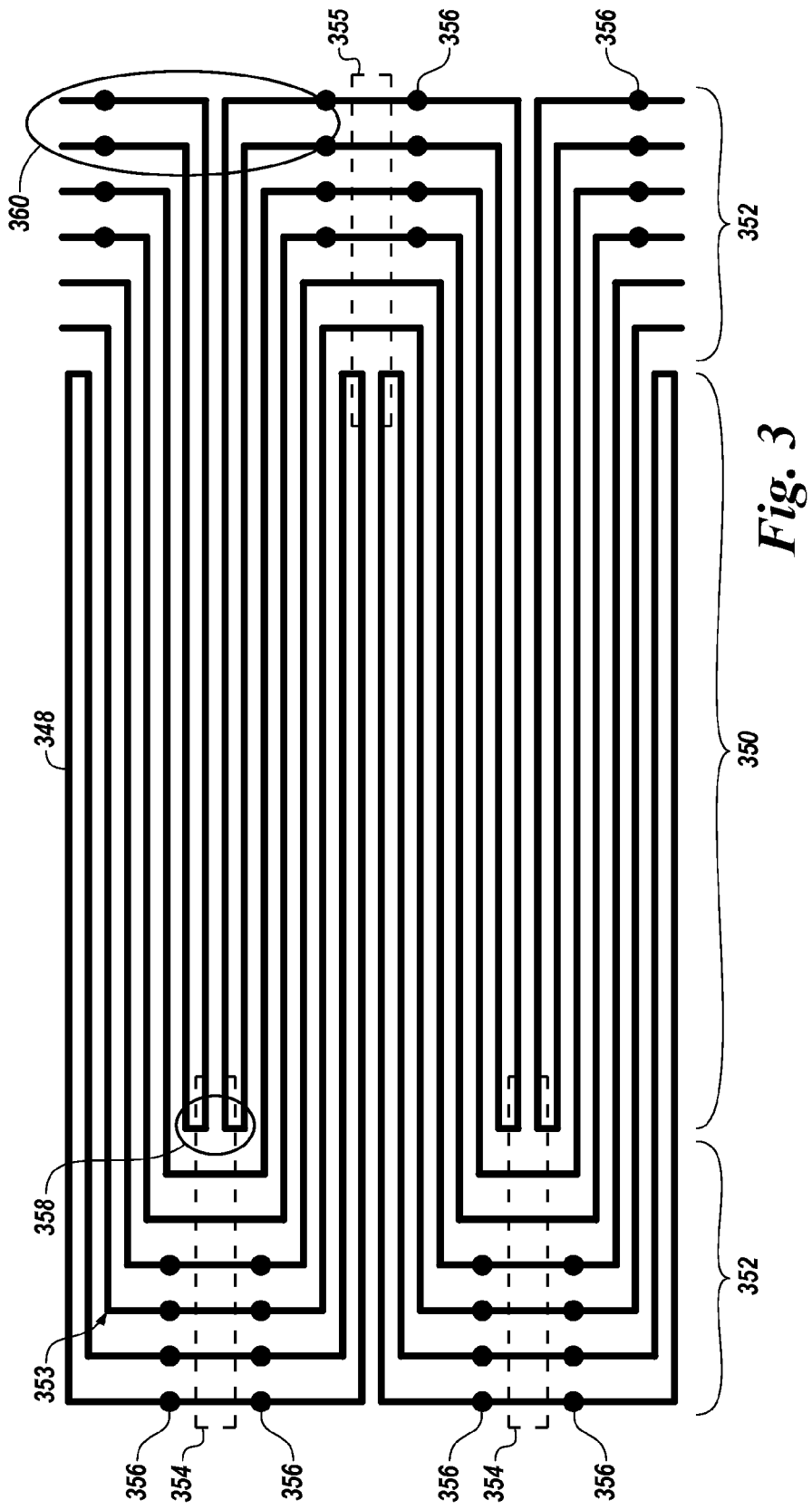
Figure 4:
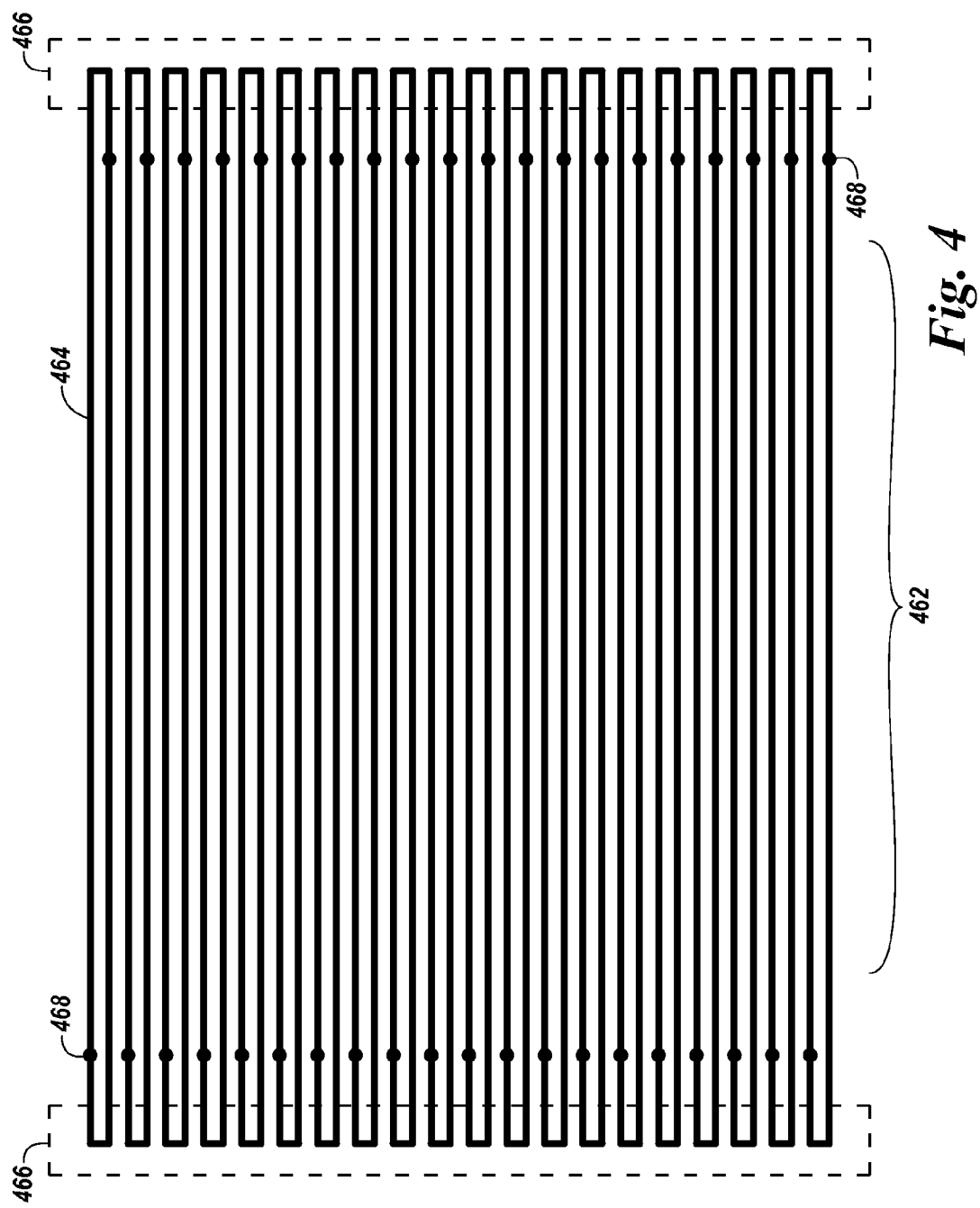

FIG. 4 illustrates an example conductive line layout and chop mask orientation associated with an array formed in accordance with a number of embodiments of the present disclosure. With increased precision of feature definition and location as compared to previous approaches, more compact layouts can be formed. That is, where the location and configuration of various features, e.g., conductive lines, can be more precisely controlled by the methods of the present disclosure with respect to sealing features before chop etching, the risk of conductive lines shorting together is reduced. Therefore, the area dedicated to socket regions associated with some cross-point array formation processes can be reduced and/or eliminated since location and configuration of conductive lines can be more accurately aligned with one another and underlying vias using the methods of the present disclosure.

FIG. 4 shows conductive lines 464 formed having loops just outside of an array region 462. However, the conductive line layout of FIG. 4 has a reduced socket region as compared to that shown in FIG. 3, for instance. According to the methods of the present disclosure for performing a chop etch, chop regions 466 can be established, for example, by forming chop masking material over the conductive lines 464 outside of the chop region 466 and subsequently performing a chop etch of material(s) within the chop region 466. Because distortion and/or movement of the conductive lines 464 can be mitigated during the chop etch as compared to previous approaches, vias 468 can be located in closer proximity to the array region and in an area where the conductive lines 464 are densely spaced.

According to some embodiments of the present disclosure, the conductive lines 464 can be cut such that the conductive lines 464 respectively extend beyond the array region 462 by substantially a same length. For example, the chop masking material can be located the chop etch cuts all word lines (or bit lines) at a same length. That is, all word lines can be cut to extend a same first length outside the array region 462, and/or all bit lines can be cut to extend a same second length outside the array region 462. The first length can be the same or different than the second length.

According to one or more embodiments of the present disclosure, a number of conductive plugs can be uniquely connected to the conductive lines 464, the number of conductive plugs being formed in the vias 468, the vias 468 being confined to one linear row per side of the array region, with the row being arranged parallel to side of the of the array region. For example, conductive plugs can be formed in vias connected to respective alternate ones of the conducting lines 464 outside the array region. Reducing and/or eliminating the size of the socket region(s) in this manner can provide benefits such as reducing the memory array footprint, among other benefits.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A memory array structure, comprising:
   a first set of conductive lines having a first loop feature chopped therefrom, wherein the first set of conductive lines is adjacent to a substrate;
   a second set of conductive lines including a plurality of second loop features;
   a sealing material conformally formed over the plurality of second loop features; and
   a number of phase change material and switch (PCMS) memory cells arranged in a cross-point array within an array region between the first set and the second set of conductive lines, the first set and the second set of conductive lines being at different elevations,
   wherein the first set and the second set of conductive lines respectively extend outside the array region, and wherein the plurality of second loop features includes a directly adjacent set of innermost loops in a first socket region on a side of the array region that are outermost loops in a second socket region on an opposite side of the array region.

2. The memory array structure of claim 1, wherein the first set and the second set of conductive lines are straight and adjacent conductive lines are everywhere parallel at a same elevation in the array region.

3. The memory array structure of claim 1, further comprising conductive plugs uniquely connected to the conductive lines, the conductive plugs being formed in vias.

4. The memory array structure of claim 1, wherein the first set of conductive lines are a portion of word lines that are everywhere parallel to one another without any portion being perpendicular to any other portion in the array region, and the second set of conductive lines are a second portion of word lines that are parallel to one another and perpendicular to a set of bit lines, the bit lines being without any portion that is perpendicular to any other portion of the bit lines in the array region.

5. A memory array structure, comprising:
a cross-point array having phase change material and switch (PCMS) memory cells;
first conductive lines adjacent a substrate and connected to a first number of the PCMS memory cells, the first conductive lines having a first loop feature chopped therefrom;
second conductive lines connected to a second number of the PCMS memory cells,
wherein materials comprising the second conductive lines include a plurality of second loop features and wherein a sealing material is conformally formed over the plurality of second loop features to retain a respective same spacing between adjacent second conductive lines and the plurality of second loop features includes a directly adjacent set of innermost loops having a same shape in a first socket region on a side of an array region that are outermost loops in a second socket region on an opposite side of the array region.

6. The memory array structure of claim 5, wherein the first conductive lines extend beyond the array region of the cross-point array, the second conductive lines extend beyond the array region of the cross-point array, and spacing between adjacent ones of the first conductive lines and adjacent ones of the second conductive lines is everywhere the same outside the array region as within the array region.

7. The memory array structure of claim 6, wherein the first conductive lines respectively extend beyond the array region by substantially a same first length, and wherein the second conductive lines respectively extend beyond the array region by substantially a same second length.

8. The memory array structure of claim 5, wherein the first conductive lines and second conductive lines are formed without bends in the array region.

9. The memory array structure of claim 5, wherein the first conductive lines respectively extend outside the array region.

10. The memory array structure of claim 5, wherein adjacent ones of the first conductive lines are spaced apart by at most a feature size outside the array region.

11. A memory array structure, comprising:
a plurality of phase change material and switch (PCMS) memory cells; and
first conductive lines adjacent a substrate and connected to a first number of the PCMS memory cells and extending outside an array region, the first conductive lines having a first loop feature chopped therefrom; and
second conductive lines connected to a second number of the PCMS memory cells, the second conductive lines being oriented substantially parallel to the first conductive lines,
wherein materials comprising the second conductive lines are formed to include a plurality of second looped features, the plurality of second looped features is sealed by a pre-chop etch conformal deposition to retain a respective same spacing therebetween outside the array region, and the plurality of second loop features includes a directly adjacent and non-overlapping set of innermost loops that are symmetric to one another in a first socket region on a side of the array region that are outermost loops in a second socket region on an opposite side of the array region.

12. The memory array structure of claim 11, wherein the materials comprising the first conductive lines retain the respective same spacing therebetween within the array region.

13. The memory array structure of claim 11, wherein materials comprising the second conductive lines are formed in part being sealed by the conformal deposition prior to the chop etch so as to retain the respective same spacing therebetween both within the array region and outside the array region.

14. The memory array structure of claim 13, further comprising conductive plugs in vias connected to respective alternate ones of the first and second conducting lines outside the array region on each side of the array region.

15. The memory array structure of claim 11, further comprising conductive plugs in vias connected to respective alternate ones of the first conducting lines outside the array region.

16. The memory array structure of claim 11, further comprising conductive plugs in vias connected to respective alternate ones of the first conducting lines outside the array region on each of two sides of the array region.

17. The memory array structure of claim 11, wherein the first conductive lines are formed by a self-aligning multiple patterning (SAMP) technique.

18. The memory array structure of claim 17, further comprising:
a spin-on dielectric (SOD) material formed over the sealing material; and
a first chop mask material formed over the sealing material, wherein the looped feature and the sealing material are not located outside the first chop mask material.

* * * * *